United States Patent
Ogata

(10) Patent No.: US 6,333,866 B1
(45) Date of Patent: Dec. 25, 2001

(54) SEMICONDUCTOR DEVICE ARRAY HAVING DENSE MEMORY CELL ARRAY AND HEIRARCHICAL BIT LINE SCHEME

(75) Inventor: Yoshihiro Ogata, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/400,968

(22) Filed: Sep. 22, 1999

Related U.S. Application Data

(60) Provisional application No. 60/102,126, filed on Sep. 28, 1998.

(51) Int. Cl.[7] ..................................................... G11C 7/00
(52) U.S. Cl. ................. 365/63; 365/189.01; 365/189.03; 365/190; 365/214; 257/210; 257/208; 257/750; 257/758
(58) Field of Search ................................ 365/189.01, 63, 365/189.03, 190, 214; 257/208, 210, 750, 758

(56) References Cited

U.S. PATENT DOCUMENTS

| | | | |
|---|---|---|---|
| Re. 33,694 | 9/1991 | McElroy | 365/149 |
| Re. 36,993 | * 12/2000 | Takashima et al. | 365/51 |
| 4,800,525 | 1/1989 | Shah et al. | 365/72 |
| 5,010,524 | * 4/1991 | Fifield et al. | 365/205 |
| 5,426,603 | * 6/1995 | Nakamura et al. | 365/149 |
| 5,487,029 | * 1/1996 | Kuroda | 365/145 |
| 5,599,480 | * 2/1997 | Tong et al. | 365/230.06 |
| 5,828,594 | * 10/1998 | Fujii | 365/63 |
| 5,838,038 | * 11/1998 | Takashima et al. | 257/301 |
| 6,209,055 | * 3/2001 | Durham et al. | 710/131 |
| 6,249,451 | * 6/2001 | Okamura | 365/63 |
| 6,249,452 | * 6/2001 | Scott | 365/69 |
| 6,249,474 | * 6/2001 | Arimoto | 365/230.03 |

OTHER PUBLICATIONS

Shah, et al., "A 4Mb DRAM with Cross–point Trench Transistor Cell", 1986 IEEE International Solid–State Circuits Conference, pp. 268–269 {See p. 369 for Figure 3.}

* cited by examiner

Primary Examiner—Viet Q. Nguyen
(74) Attorney, Agent, or Firm—Robby T. Holland; W. James Brady, III; Frederick J. Telecky, Jr.

(57) ABSTRACT

A semiconductor device architecture (200) is disclosed. Like unit circuits (202), arranged in rows and columns, are coupled to lower conductive segments (204a–204h). The lower conductive segments (204a–204h) are arranged in an "open" configuration, allowing adjacent unit circuits (202) be accessed simultaneously. The lower conductive segments (204a–204h) are coupled to higher conductive segments (208a–208f) by reconnector circuits (210a and 210b). The higher conductive segments (208a–208f) are arranged into folded pairs (208a/208d, 208b/208e and 208c/208f) between differential-type amplifiers (212a and 212b). The reconnector circuits (210a and 210b) each have a reconnect configuration and a switch configuration. In a reconnect configuration, the reconnector circuits (210a and 210b) couple adjacent folded higher conductive segment pairs to one another. In a switch configuration, the reconnector circuits (210a and 210b) couple a matching lower conductive segment (204a–204h) to each higher conductive segment of the adjacent higher conductive segment pairs.

13 Claims, 13 Drawing Sheets

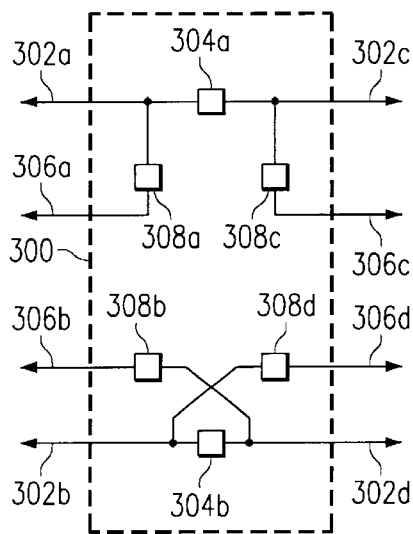
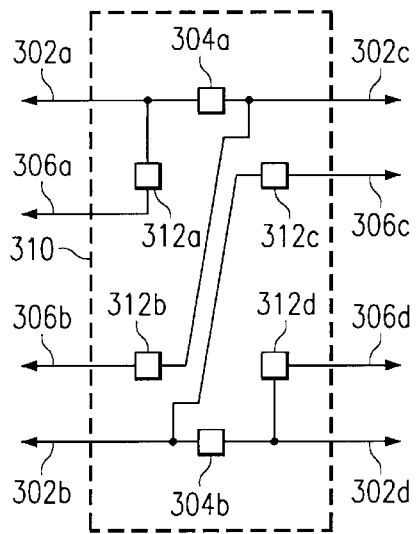
FIG 3A
FIG 3B
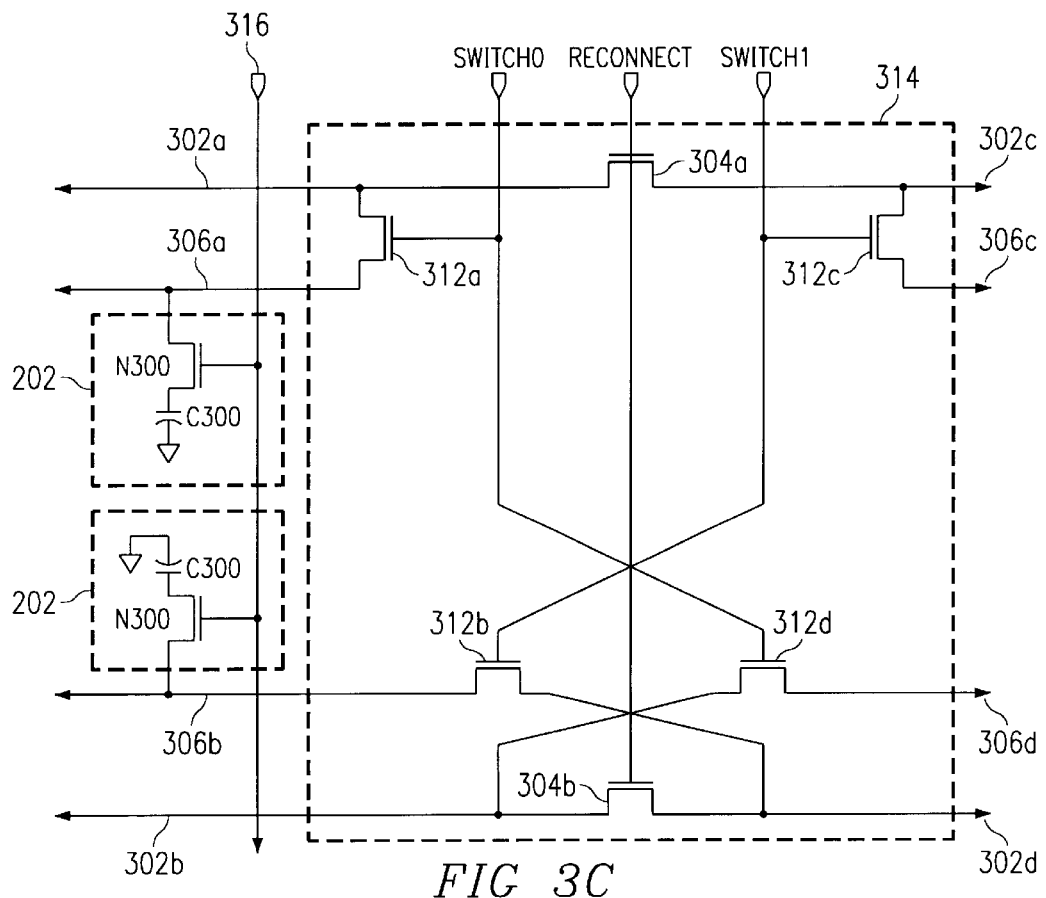
FIG 3C

SEMICONDUCTOR DEVICE ARRAY HAVING DENSE MEMORY CELL ARRAY AND HEIRARCHICAL BIT LINE SCHEME

This application claims priority under 35 USC §119(e)(1) of provisional application number 60/102,126 filed Sep. 28, 1998.

TECHNICAL FIELD

The present invention relates generally to semiconductor memory devices, and more particularly to the memory cell arrays and surrounding circuitry of semiconductor memory devices.

BACKGROUND OF THE INVENTION

The increased computing power of each generation of electronic systems has given rise to the need for semiconductor memory devices of greater and greater storage density. Storage density refers the amount of data that can be stored in a given area on a semiconductor substrate. Because integrated circuits are typically manufactured by forming multiple die on a semiconductor wafer, in general, the higher the density of the design, the more economical it is to produce the integrated circuit. This can apply not only to "standalone" semiconductor memory devices (those devices whose only function is the storage of data), but also to devices having "embedded" memory as well. Embedded memory is a section of memory that is included on a larger integrated circuit. Embedded higher density semiconductor memory designs also free up more area on the larger integrated circuit, allowing for greater flexibility in design and/or added features.

A preferred type of semiconductor memory device, due to its high density and relatively low power consumption characteristics, is the dynamic random access memory (DRAM). Because of this, any practical approaches to improving DRAM density could benefit a great number of electronic systems.

Conventional DRAM architectures are well known. A DRAM will typically include an array of memory cells that are coupled to bit lines by the activation of word lines. The DRAM will further include a number of sense amplifiers, each of which amplifies a differential signal at its two inputs. The inputs of each sense amplifier are coupled to bit lines, and in any active operation, one input will be coupled to a bit line carrying a data signal while the other input will be coupled to a reference signal. A data signal that is greater than the reference signal will be amplified to generate one logic value (a logic "1" for example), while a data signal that is less than the reference signal will be amplified to generate another logic value (a logic "0" for example).

DRAMs architectures include "open" bit line architectures as well as "folded" bit line architectures. Typical open bit line architectures are utilized in dense memory cell arrangements, where the activation of a word line results in data being placed on adjacent bit lines. In such applications the reference signal is often generated by a "dummy" memory cell. A drawback to open bit line architectures is the susceptibility of such architectures to noise. Such noise can limit the size of the bit lines or cell capacitors, and/or require additional sense amplifiers. For this reason, open bit line architectures are usually avoided.

Folded bit line architectures reduce the adverse effects of noise. In a folded bit line architecture, adjacent bit lines each form a folded bit line pair. Each folded bit line pair is coupled as the inputs to a differential-type sense amplifier. When a word line is activated, data is placed on one bit line of the bit line pair but not on the other bit line of the bit line pair. This allows the adjacent bit line to carry a reference signal. By using adjacent bit lines (which have the same general dimensions and are made of the same material) the majority of the noise will be common mode noise, and can be rejected by the sense amplifier.

An example of a prior art folded bit line DRAM memory array arrangement is set forth in FIGS. 1A–1E. The prior art folded bit line DRAM array is composed of a number of memory cells, two of which are set forth in FIG. 1A. The memory cells are designated by the general reference characters 100a and 100b, and in the view of FIG. 1A, are shown to be formed in an active area 102 that is surrounded by an insulation region 104. Each of the memory cells (100a and 100b) includes an associated word line (106a and 106b) created over the active area 102 to thereby form a metal-oxide-semiconductor (MOS) transistor. The memory cells (100a and 100b) share a common bit line contact 108 that is formed between the word lines (106a and 106b).

The memory cells (100a and 100b) set forth in FIG. 1A are often referred to as "$8F^2$" memory cells, because of the area occupied by each memory cell. For a given semiconductor device manufacturing process, given a minimum feature size, shown as "F," the area formed by each memory cell is a rectangle having sides of 4F and 2F. The memory cell pair (100a and 100b) will thus occupy $16F^2$.

To assist in understanding the arrangement of the various embodiments set forth herein, a prior art memory cell array utilizing $8F^2$ memory cells will be described in a series of top plan views in FIGS. 1B to 1E. FIGS. 1B to 1E all set forth a portion of a DRAM array with the area of memory cell pairs being delineated with a bold dashed line. Each view illustrates a different set of layers. FIG. 1B illustrates the word lines (110a–110h) and bit line contacts as set forth in FIG. 1A. Only selected of the bit line contacts are identified by the reference character 112 to avoid cluttering the view of FIG. 1B. In addition, storage node contacts for each memory cell are also set forth. For the same reasons, only selected of the storage contacts are identified by the reference character 114. The storage node contacts 114 connect the transistors formed within the substrate to storage capacitors that are disposed above the substrate. The bit lines contacts 112 connect bit lines to the substrate.

FIG. 1C is a top plan view illustrating additional layers formed on top of those set forth in FIG. 1B. Included are local bit lines (116a–116c) and storage nodes. Selected storage nodes are shown as items 118. In addition, for reference, the bit line contacts 112 have been carried over from FIG. 1B. The storage node arrangement of FIG. 1C describes a "capacitor-under-bit line" (CUB) arrangement. Thus, prior to the formation of the bit line contacts 112, the storage nodes 118 are formed. It is understood that the storage nodes 118 function as one plate of a storage capacitor. Accordingly, subsequent to their formation, a capacitor dielectric will be formed over the storage nodes 118, which will then be covered by a capacitor plate common to all of the storage capacitors.

The local bit lines (116a–116c) of FIG. 1C are shown to extend over the substrate, perpendicular to the word lines (110a–110h). The local bit lines (116a–116c) make contact to each of the memory cell pairs at the corresponding the bit line contacts 112.

FIG. 1D is the same top plan view as FIG. 1C, but illustrates a different capacitor configuration. Instead of a CUB type arrangement, FIG. 1C illustrates the case of a capacitor-over-bit line (COB) arrangement. Thus, while FIG. 1D includes the same bit line (116a–116c) and bit line contact 112 arrangement, COB type storage nodes, selected of which are shown as items 120 are also set forth. As in the case of FIG. 1C, a capacitor dielectric and a common plate are formed over the storage nodes 120.

FIG. 1E illustrates how a "global" bit lines (122a–122c) are formed over the local bit lines (116a–116c). The "global" bit lines (122a–122c) are typically made from a lower resistance material than the local bit lines (116a–116c). Data signals on the local bit lines (116a–116c) may be coupled to corresponding global bit lines (122a–122c) by way of bit line select circuits (not shown in FIGS. 1A–1E).

FIGS. 1A–1E can also be instructive to illustrate additional concerns that arise in the manufacture of integrated circuits. If the conductive layers required to form the storage capacitors (i.e., the storage node and the common plate) are discounted, three conductive layers are required to form the memory cell array. The first conductive layer forms the word lines (110a–110h), and may be doped polysilicon. The second layer forms the local bit lines (116a–116c), and may be doped polysilicon or a metal layer. The third layer forms the global bit lines (122a–122c), and may be formed from a metallization layer. The fewer number of conductive layers that are required to manufacture a device, the less expensive and higher yielding (having fewer defects) the device can be. Thus, it is desirable to use as few conductive layers as possible to arrive at the most compact and noise resistant design possible.

U.S. Pat. No. Re. 33,694 reissued to David J. McElroy on Sep. 17, 1991 and titled DYNAMIC MEMORY ARRAY WITH SEGMENTED BIT LINES, sets forth a DRAM having a memory cell array with segmented bit lines. As best shown in FIG. 5 of McElroy, the DRAM includes bit lines (33) that are coupled to bit line segments (87) by transistors (88). While McElroy reduces some effects of noise by utilizing folded bit lines (33), a drawback to the approach of McElroy is the capacitance presented by the bit lines (33). The charge provided by the storage capacitors (85) must be capable of creating a differential voltage not only a bit line segment (87), but also on the entire bit line (33) as well. This may limit how many memory cells can be connected to the bit line segments (87) and the maximum length of the bit lines (33). In addition, McElroy utilizes dummy memory cells (91/90) requiring additional area and the use of dummy word lines (92).

U.S. Pat. No. 5,034,920 issued to Robert N. Rountree on Jul. 23, 1991 and titled CROSS POINT ARRAY MEMORY DEVICE, sets forth a DRAM array that allows for high density memory cell arrangements, such as those found in conventional open bit line architectures, while at the same time reducing the noise effects associated with open bit line arrays. The approach of Rountree is best understood with reference to FIG. 3 of the patent. The array (41) includes partial bit lines or second portions (48, 56, 50 and 58) that are coupled to memory cells (40-1-1 to 40-4-4). Memory cells of adjacent second portions (for example memory cells 40-4-1 and 40-3-1) are accessed by the same word line (64-5). However, unlike a conventional open bit line arrangement, each second portion (48, 56, 50 and 58) is coupled to its associated sense amplifier (42 and 44) by a first portion (46, 54, 52 and 60). Adjacent first portions (for example 54 and 60) have the advantages of folded bit lines as they can be formed parallel to one another, and made with identical dimensions and materials. Like McElroy, a memory cell must be capable of creating a differential voltage signal on a second portion (48, 56, 50 or 58) and its associated first portion (46, 54, 52 or 60). This may limit how many memory cells may be coupled to the second portions (48, 56, 50 or 58) and/or the overall length of the first portions (46, 54, 52 or 60).

Another variation of a DRAM array is set forth in "A 4Mb DRAM with Cross-point Trench Transistor Cell" 1986 *IEEE International Solid-State Circuits Conference* (ISSCC 1986) by Ashwin H. Shah et al. FIG. 2 of the Shah et al. article illustrates what is referred to as a "Double-Ended Adaptive Folded (DEAF) bit line scheme. The DEAF bit line scheme includes segmented bit lines coupled to memory cells in such a manner, that the activation of a word line will couple adjacent memory cells to adjacent segmented bit lines. A selected pair of segmented bit lines is then connected to a pair of global bit lines by segment select switches. The DEAF bit line scheme further includes a number of section select switches that will, in any given access, divide the global bit lines into a left pair of global bit lines and a right pair of global bit lines. Both the left and right pairs will then include one global bit line portion coupled to a segmented bit line and another coupled to a dummy memory cell.

One possible drawback to the DEAF bit line scheme of the Shah et al. article is the lack of balance in the capacitance seen by the inputs of the sense amplifiers. As just one example, in the access illustrated by FIG. 2, the section select 2 switches are active and the section select 1 switches are inactive. The left sense amplifier will have one input that sees the capacitance of a small global bit line section and a segmented bit line, while the other input will see the capacitance of only a small global bit line section. The right sense amplifier will have one input that sees the capacitance of two global bit line sections and another input that sees the capacitance of one global bit line section and one segmented bit line. The scheme of the Shah et al. article also utilizes dummy memory cells, and so includes the drawbacks of such an approach referred previously.

U.S. Pat. No. 4,800,525 issued to Ashwin H. Shah et al. on Jan. 24, 1989 and titled DUAL ENDED FOLDED BIT LINE ARRANGEMENT AND ADDRESSING SCHEME sets forth a bit line scheme that resembles the DEAF bit line scheme of the Shah et al. ISSCC article. Referring now to FIG. 5 of the Shah et al. patent, the Shah et al. patent is shown to include segment lines (52), each coupled to a number of bit lines shown as BL1 and BL2. Like the ISSCC 1986 article, section switches are used to divide the bit lines (BL1 and BL2) into a left section pair and a right section pair. The lack of balanced capacitance present in the scheme of the ISSSCC 1986 article is addressed in the Shah et al. patent by the utilization of dummy segments (56). The activation of dummy segments (56) results in both inputs to the sense amplifier inputs seeing a similar capacitance. One input will see the capacitance of a certain bit line length (BL1 or BL2) and a segment line (32), while the other input will see the same bit line length (BL1 or BL2) and a dummy segment (56). A drawback to such an approach is the additional area required for the dummy segments. Further, the Shah et al. patent utilizes dummy word lines and dummy memory cells, requiring additional space within the array.

It would be desirable to arrive at a semiconductor memory device having a dense memory cell array that does not present the drawbacks of the prior art. It would further be desirable to arrive at such a dense memory cell array without the necessity of additional metallization layers.

SUMMARY OF THE INVENTION

According to the embodiments described herein, a semiconductor device includes a number of unit circuits, such as memory cells, that are accessed by a hierarchy of conductive segments, including lower conductive segments and higher conductive segments. The higher conductive segments are arranged in "folded" pairs that extend in series between opposing differential-type amplifiers (such as sense amplifiers). Reconnector circuits are coupled between adjacent conductive segment pairs, and function in either a reconnect mode or a switch mode. In the reconnect mode, the reconnector circuits couples adjacent higher conductive segments pairs to one another, creating a large folded segment pair. In a switch mode, the reconnect circuits couple each higher conductive segment to a corresponding lower conductive segment. The lower conductive segments are coupled to the unit circuits and have matching impedance values. The resulting structure reduces noise effects due to the folded higher bit line structures, while at the same time providing like impedance at the two inputs of the differential-type amplifiers.

According to one aspect of the embodiments, the lower conductive segments are disposed diagonally with respect to the higher conductive segments.

According to another aspect of embodiments, the unit circuits are dynamic random access memory (DRAM) cells, having a minimum feature size of F and a total area of $6F^2$.

According to one memory device embodiment, the lower conductive segments are lower bit lines having an "open" bit line configuration, and the higher conductive segments are upper bit lines having a folded bit line configuration.

BRIEF DESCRIPTION OF THE DRAWINGS

FIGS. 3A–3C are block schematic diagrams illustrating reconnector circuits that may be used in the first embodiment of FIG. 2.

DETAILED DESCRIPTION OF THE EMBODIMENTS

The embodiments described herein illustrate a semiconductor device memory cell array and the surrounding circuits. The embodiments describe a number of compact memory cell arrays having memory cell sizes that are less than $8F^2$ where "F" describes a minimum achievable feature size. Noise is reduced by utilizing a unique hierarchical bit line scheme that includes folded bit line portions and open bit line portions to provide matching impedance at sense amplifier inputs. In the particular dynamic random access memory (DRAM) applications illustrated, a dummy memory cell is not required.

Figure 2:
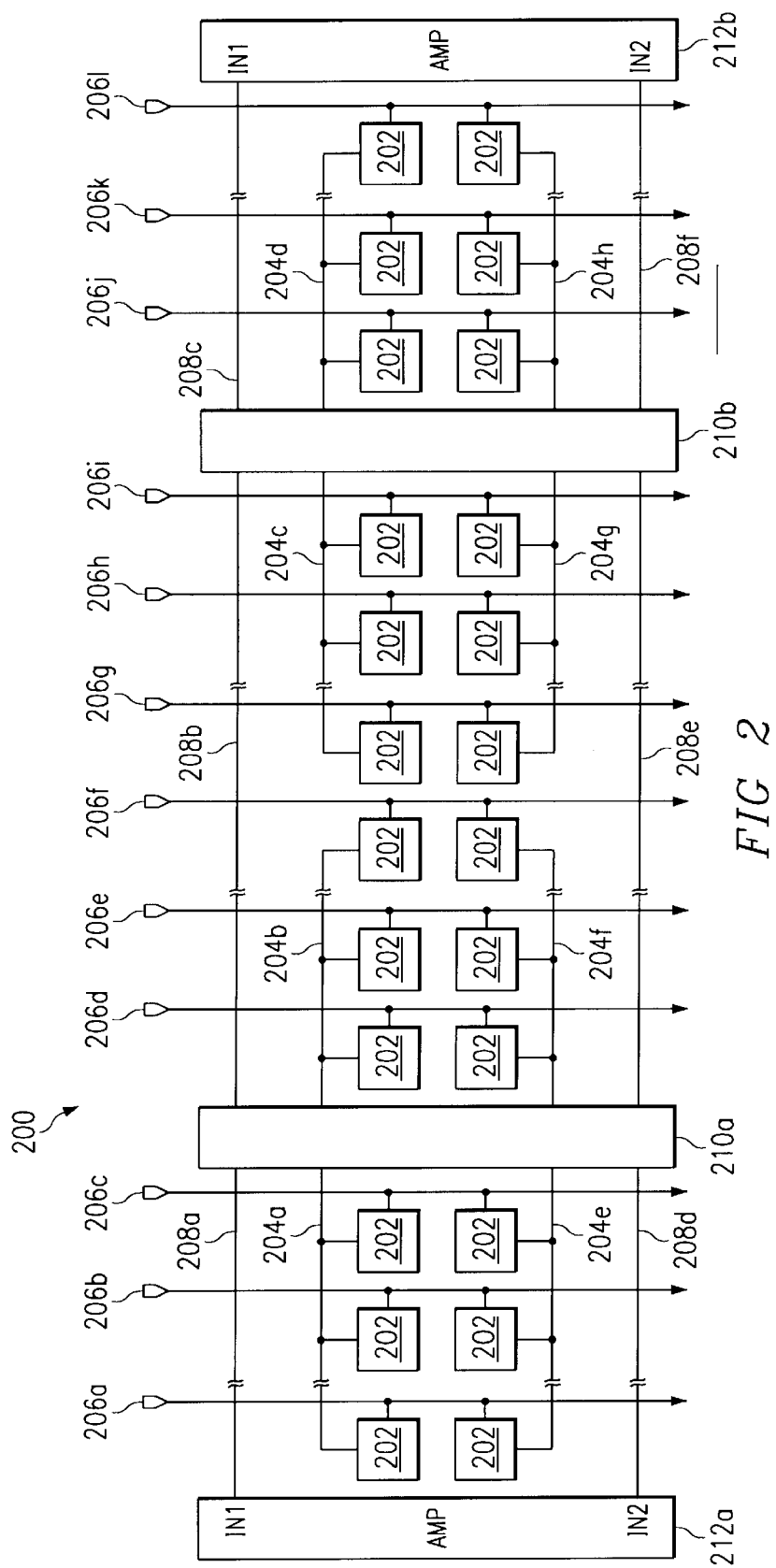
FIG. 2 is a block schematic diagram illustrating a first embodiment.

A first embodiment is set forth in block schematic diagram in FIG. 2, and designated by the general reference character 200. The first embodiment 200 includes a number of like unit circuits shown as items 202. The unit circuits 202 are accessed by way of a number of conductive lines to perform a given function in a larger semiconductor device. As just a few examples, in a memory device application the unit circuits could be volatile memory cells or non-volatile memory cells. In a programmable logic application, the unit circuits could be logic circuits, or a combination memory logic circuit. In the first embodiment 200, the unit circuits 202 are DRAM memory cells, and each include a pass transistor and a storage capacitor.

In the particular arrangement of FIG. 2, the unit circuits 202 are arranged in an array having rows that run vertically in FIG. 2, and columns that run horizontally in FIG. 2. The unit circuits 202 are connected to one another in the column direction by lower conductive segments 204a–204h, and in the row direction by control lyines 206a–206l. In the particular DRAM embodiment of FIG. 2, the lower conductive segments (204a–204h) are bit lines, while the control lines (206a–206l) are word lines. Thus, the activation of one of the control lines (206a–206l) results in unit circuits 202 being coupled to adjacent lower conductive segments (204a–204h). For example, the activation of control line 206b would result in unit circuits 202 being coupled to lower conductive segments 204a and 204e. It is understood that a large number of unit circuits 202 could be coupled to the same lower conductive segment (204a–204h). As just one example, in a memory device application, more than a hundred memory cells could be coupled to the same lower conductive segment (204a–204h).

The first embodiment 200 is shown to further include higher conductive segments 208a–208f Selected of the lower conductive segments (204a–204h) are coupled to the higher conductive segments (208a–208f) by reconnector circuits 210a and 210b. This arrangement results in the lower conductive segments (204a–204h) representing a lower order access to the unit circuits 202 and the higher conductive segments (208a–208f) representing a higher order access to the unit circuits 202. The higher order and lower order conductive segment create a hierarchical structure, having a lower order "non-folded" arrangement of conductive segments (204a–204h) and a higher order "folded" arrangement of conductive segments (208a–208f).

The higher conductive segments (208a–208f) can be conceptualized as being arranged into associated pairs. This pairing provides impedance matching and common noise effects between the associated pairs. For example, the higher conductive segments of FIG. 2 include pairs 208a/208d, 208b/208e and 208c/208f. In the particular embodiment of FIG. 2, the higher conductive segments of each pair (208a/208d, 208b/208e or 208c/208f) have the same physical dimensions and are fabricated from the same material. Due to this arrangement, in memory applications, the higher conductive segments pairs (208a/208d, 208b/208e or 208c/208f) function like folded bit line segment pairs, advantageously having common noise effects and matched impedance.

Each group of lower conductive segments (204a–204h) is coupled to a corresponding group of higher conductive segments (208a–208f) by reconnector circuits 210a and 210b. In the particular arrangement of FIG. 2, each reconnector circuit (210a and 210b) couples a group of four higher conductive segments to a group of four lower conductive segments. For example, a group that includes lower conductive segments 204a, 204b, 204e and 204f is coupled by reconnector circuit 210a to a group that includes higher conductive segments 208a, 208b, 208d and 208e. Likewise, reconnector circuit 210b couples a different group of lower conductive segments 204c/204d/204g/204h to a different combination of higher conductive segments (208b/208e/ 208c/208f). It is noted that the higher conductive segments pair 208b/208e is shared by adjacent reconnector circuits (210a and 210b)

Each reconnector circuit (210a and 210b) has at least two configurations, including a switch configuration and a "reconnect" configuration. In the switch configuration, the reconnector circuit (210a or 210b) will couple its associated group of lower conductive segments to its associated group of higher conductive segments. In contrast, in the reconnect configuration, the reconnector circuit (210a or 210b) will couple adjacent higher conductive segments pairs to one another. Thus, in the particular arrangement of FIG. 2, reconnector circuit 210a, in the reconnect mode, will couple higher conductive segments pair 208a/208d to pair 208b/208e. Similarly, in the reconnect mode, reconnector circuit 210b will couple higher conductive segment pair 208b/208e to pair 208c/208f.

The reconnector circuits (210a and 210b) enable the higher conductive segments pairs (208a/208d, 208b/208e, and 208c/208f) to be disposed in series with one another between a first differential-type amplifier 212a and a second differential-type amplifier 212b. The differential-type amplifiers (212a and 212b) are shown to each include a first input IN1 and a second input IN2. Thus, the higher conductive segments (208a–208f) can be conceptualized as including first higher conductive segments (208a–208c), arranged in series between the first inputs (IN1) of the differential-type amplifiers (212a and 212b), and second higher conductive segments (208d–208f), arranged in series between the second inputs (IN2) of the differential-type amplifiers (212a and 212b).

When enabled, the differential-type amplifiers (212a and 212b) amplify differential signals appearing between their respective inputs (IN1 and IN2). Because of this, the differential-type amplifiers (212a and 212b) will have a high common mode rejection ratio and thus take advantage of the "folded" arrangement of the higher conductive segment pairs (208a/208d, 208b/208e, and 208c/208f). In a memory application, the differential-type amplifiers (212a and 212b) may be sense amplifiers.

To better illustrate the switch and reconnect configuration of the reconnector circuits (210a and 210b), two examples of reconnector circuits are set forth in FIGS. 3A and 3B. A first reconnector circuit is set forth in FIG. 3A, and designated by the general reference character 300. The first reconnector circuit 300 is shown to be coupled between a first folded pair of higher conductive segments 302a/302b and a second folded pair of higher conductive segments 302c/302d. To establish the reconnect configuration, the particular reconnect circuit 300 of FIG. 3A includes a first reconnect impedance path 304a and a second reconnect impedance path 304b. The first and second reconnect impedance paths (304a and 304b) are controllable, providing a low impedance path or a high impedance path depending upon the configuration.

In the reconnect configuration, the first and second reconnect impedance paths (304a and 304b) have a low impedance, and couple the adjacent higher conductive segment pairs 302a/302b and 302c/302d to one another. This creates a longer folded pair of conductive lines, with the first line of the pair including higher conductive segment 302a, first reconnect impedance path 304a, and higher conductive segment 302c. The second line of the longer pair includes higher conductive segment 302b, second reconnect impedance path 304b, and higher conductive segment 302d. By matching the first and second reconnect impedance paths (304a and 304b), matching impedance of the longer folded pair is maintained.

In the switch configuration, the reconnect impedance paths (304a and 304b) have a high impedance, and isolate adjacent higher conductive segment pairs 302a/302b and 302c/302d) from one another. This isolation allows the two different folded pairs (302a/302b and 302c/302d) to function independently from one another and carry different information signals.

The first reconnector circuit 300 is also coupled to a corresponding group of lower conductive segments (306a–306d). In order to establish the switch configuration, the reconnector circuit 300 includes switch impedance paths 308a–308d disposed between each higher conductive segment (302a–302d) and an associated lower conductive segment (306a–306d). Like the reconnect impedance paths (304a and 304b), the switch impedance paths (308a–308d) are controllable, providing high or low impedance depending upon the configuration.

In the switch configuration, the switch impedance paths (308a–308d) have a low impedance. As a result, each higher conductive segment (302a–302d) is coupled to its associated lower conductive segment (306a–306d). Thus, in the particular arrangement of FIG. 3A, higher conductive segments 302a and 302c are coupled to lower conductive segments 306a and 306c, respectively. In addition, higher conductive segments 302b and 302d are coupled to lower conductive segments 306d and 306b, respectively. Assuming the lower conductive segments (306a–306d) are of equal length and made from the same material, the switch configuration results in impedance matching between the connected lower and higher conductive segments. That is, the impedance of conductive pair combinations 302a/306a, 302c/306c, 302b/306d and 302d/306b is essentially the same.

Because of the connection arrangement of the switch configuration, if the higher conductive segments 302a and 302b are considered "first" higher conductive segments, lower conductive segments 306a and 306c can be considered "first" lower conductive segments because they are coupled to the first higher conductive segments (302a and 302b). For the same reason, if higher conductive segments 302b and 302d are considered "second" higher conductive segments, lower conductive segments 306a and 306d can be considered "second" lower conductive segments. When viewed in this manner, the reconnector circuits 300, in the reconnect configuration, will couple a pair of first higher conductive segments (302a/302c) to an associated pair of first lower conductive segments (306a/306c), and a pair of sec on d higher conductive segments (302b/302d) to a pair of second lower conductive segments (306d/306b). Further, the reconnector circuit 300 is shown to be coupled between the higher conductive segments pairs (302a/302c and 302b/302d) and lower conductive segment pairs (306a/306c and 306d/306b).

A second example of a reconnector circuit is set forth in FIG. 3B and designated by the general reference character 310. The second reconnector circuit 310 is coupled to higher conductive segments (302a–302d) in the same general arrangement as the reconnector circuit of FIG. 3A. In addition, the second reconnector circuit 310 includes first and second reconnect impedance paths (304a and 304b) that function in the same manner as those set forth in FIG. 3A.

The second example reconnector circuit 310 is also coupled to a group of first lower conductive segments 306a–306d. Like the first example reconnector circuit 300 the four higher conductive segments (302a–302d) are coupled to the four lower conductive segments (306a–306d) by switch impedance paths (312a–312d). The second example reconnector circuit 310 differs from that set forth in FIG. 3A in how the higher conductive segments (302a–302d) are coupled to the lower conductive segments (306a–306d). Like the first reconnector circuit 300 of FIG. 3A, the second reconnector circuit 310 of FIG. 3B includes a first switch impedance path 312a couples higher conductive segment 302a to lower conductive segment 306a. However, the remaining connections are different. As shown in FIG. 3B, switch impedance path 312b couples higher conductive segment 302c to lower conductive segment 306b, switch impedance path 312c couples higher conductive segment 302b to lower conductive segments 306c, and switch impedance path 312d couples higher conductive segment 302d to lower conductive segment 306d. Thus, if higher conductive segments 302a and 302c are considered to be "first" higher conductive segments, then lower conductive segments 306a and 306b would be an associated pair of "first" lower conductive segments. Similarly, if higher conductive segments 302b and 302d are considered "second" higher conductive segments, the associated "second" lower conductive segments would be the lower conductive segments 306c and 306d.

It is noted that the second reconnector circuit example 310 also maintains an impedance match like the first reconnector circuit example 300. That is, the impedance of conductive pair combinations 302a/306a, 302c/306b, 302b/306c and 302d/306d is essentially the same.

It is noted that the reconnector circuit examples of FIGS. 3A and 3B result in compact structures that allow the lower conductive segments (306a–306d) and higher conductive segments (302a–302d) to be placed close to one another. Thus, while the higher and lower conductive segments (302a–302d and 306a–306d) are shown to be somewhat separated from one another in FIGS. 3A and 3B, they may be physically close together. Accordingly, as just one particular example, lower conductive segments 306c and 306d can be considered to be adjacent to lower conductive segment 306a (in the horizontal direction), while lower conductive segments 306b and 306d can also be considered to be adjacent to lower conductive segment 306a (in the vertical direction).

FIG. 3C is a schematic diagram illustrating one DRAM embodiment of the reconnector circuit set forth in FIG. 3A. The DRAM embodiment is designated by the general reference character 314 and is shown to be coupled to four higher conductive (upper bit line) segments 302a–302d and four lower conductive (lower bit line) segments 306a–306d. The reconnect impedance paths 304a and 304b are shown to include the source-drain path of n-channel metal (conductor)-oxide(insulator)-semiconductor (MOS) transistors. Similarly, the switch impedance paths 312a–312d are also shown to include the source-drain paths of n-channel MOS transistors. Two unit circuits 202 are also set forth in FIG. 3C, and are shown to each include an n-channel MOS pass transistor N300 and a storage capacitor C300. The sources of transistors N300 are coupled to their associated lower conductive segments (306a and 306b), their drains are coupled to their associated storage capacitor C300, and their gates are commonly coupled to a control (word) line 316.

Figure 4A:
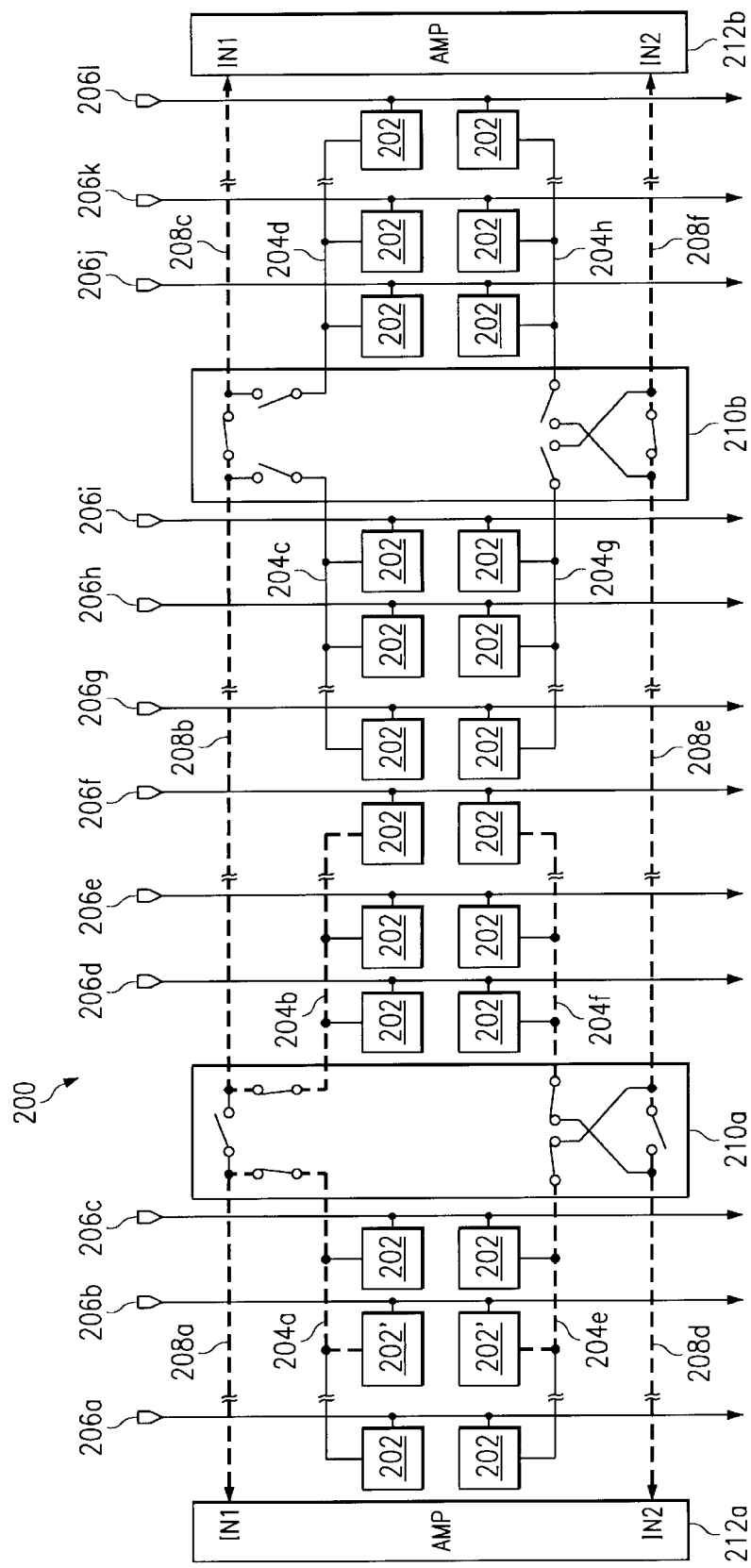
FIGS. 4A and 4B are block schematic diagrams illustrating the operation of the first embodiment.
Figure 4B:
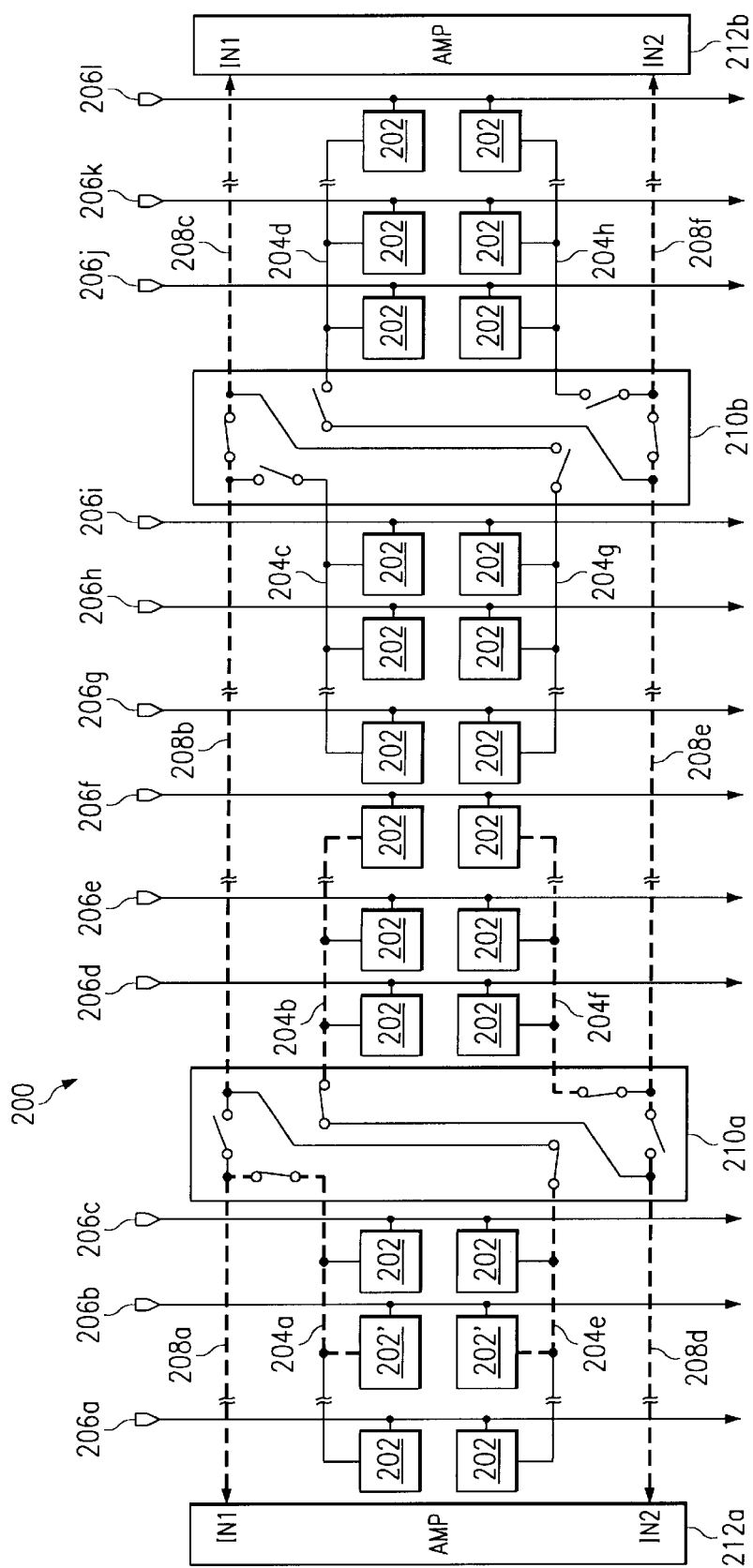

To better understand the operation of the first embodiment, two examples of the first embodiment are set forth in FIGS. 4A and 4B. FIG. 4A illustrates an example of the first embodiment 200 that utilizes the reconnector circuit set forth in FIG. 3A. FIG. 4B illustrates an example of the first embodiment 200 that utilizes the reconnector circuit set forth in FIG. 3B. FIGS. 4A and 4B both set forth the access of two adjacent unit circuits, shown as 202'.

Referring now to FIG. 4A, the access illustrated by FIG. 4A is initiated by the activation of control line 206b. With control line 206b activated, unit circuits 202' place information signals on their associated lower conductive segments 204a and 204e. In the particular access illustrated by FIG. 4A, reconnector circuit 210a is in the switch configuration while reconnector circuit 210b is in the reconnect configuration. As a result, higher conductive segment 208b is coupled to higher conductive segment 208c, and higher conductive segment higher 208e is coupled to higher conductive segment 208f. At the same time, higher conductive segment 208a is isolated from higher conductive segment 208b, and higher conductive segment 208d is isolated from higher conductive segment 208e. The resulting arrangement thus includes a left folded conductive segment pair, formed by higher conductive segments 208a and 208d, and a right folded conductive segment pair, formed by the joined adjacent higher conductive segment pairs 208b/208c and 208e/208f.

Within reconnector circuit 210b, lower conductive segments 204c, 204d, 204g and 204h are isolated from their associated higher conductive segments 208b, 208c, 208e and 208f. In contrast, within reconnector circuit 210a, lower conductive segments 204a, 204b, 204e and 204f are coupled to higher conductive segments 208a, 208b, 208e and 208d, respectively. This arrangement results in the impedance matching previously described. For the particular access of FIG. 4A, the first input (IN1) of differential-type amplifier 212a is coupled to an impedance that includes higher conductive segment 208a, a switch impedance path within reconnector circuit 210a, and lower conductive segment 204a. The second input (IN2) of differential-type amplifier 212a will be coupled to a matching impedance that includes higher conductive segment 208d, a switch impedance path within reconnector circuit 210a, and lower conductive segment 204f.

The matching impedance also occurs for the inputs of the opposing second differential-type amplifier 212b. The first input (IN1) of second differential-type amplifier 212b is coupled to an impedance created by higher conductive segment 208c, a reconnect impedance path within reconnector circuit 210b, higher conductive segment 208b, a switch impedance path within reconnector circuit 210a, and lower conductive segment 204b. The second input (IN2) of the second differential-type amplifier 212b sees a matching impedance that includes higher conductive segment 208f, a reconnect impedance path within reconnector circuit 210b, higher conductive segment 208e, a switch impedance path within reconnector circuit 210a, and lower conductive segment 204e. The paths making up the matching impedance are shown in FIG. 4A as dashed bolded lines.

Thus, in a memory device application, the first embodiment 200 allows access to adjacent memory cells 202' via folded bit line portions, formed by higher conductive segment pairs 208a/208d, 208b/208e and 208c/208f, and impedance matched open bit line portions, formed by lower conductive segment pairs 204a/204f, 204b/204e, 204c/204h, and 204d/204g. The like impedance at each input to the differential-type amplifiers (212a and 212b) allows the use of a reference voltage (often referred to as a "bit line reference voltage") instead of dummy memory cells. This contributes to the compactness of the memory cell array.

The example of the first embodiment set forth in FIG. 4B illustrates an access of the same unit circuit pair (202') as FIG. 4A. FIG. 4B differs from FIG. 4A in that the use of a different reconnector circuit structure results in a different combination of conductive segments being coupled to the inputs of the differential-type amplifiers (212a and 212b). In particular, the first input (IN1) of differential-type amplifier 212a is coupled to the same structures as the example of FIG. 4A; higher conductive segment 208a, a switch impedance path within reconnector circuit 210a, and lower conductive segment 204a. However, the second input (IN2) of differential-type amplifier 212a will be coupled to a matching impedance formed by higher conductive segment 208d, a switch impedance path within reconnector circuit 210a, and lower conductive segment 204b.

In the case of the second differential-type amplifier 212b of FIG. 4B, the first input (IN1) is coupled to an impedance created by higher conductive segment 208c, a reconnect impedance path within reconnector circuit 210b, higher conductive segment 208b, a switch impedance path within reconnector circuit 210a, and lower conductive segment 204e. The second input (IN2) of differential-type amplifier 212b sees a matching impedance that includes higher conductive segment 208f, a reconnect impedance path within reconnector circuit 210b, higher conductive segment 208e, a switch impedance path within reconnector circuit 210a, and lower conductive segment 204f. The paths making up the matching impedance are also shown as dashed bolded lines in FIG. 4B.

The various accesses shown in FIGS. 4A and 4B illustrate how the lower conductive segments (204a–204h) can be considered to each be associated with a particular differential-type amplifier (212a or 212b). As is understood by the block diagrams of FIGS. 4A and 4B, the switching arrangement of the reconnector circuits 210a and 210b results in the same lower conductive segments (204a–204h) being coupled to the same differential-type amplifier (212a or 212b) when its respective reconnector circuit (210a or 210b) is in the switch configuration. In particular, in the arrangement of FIG. 4A, first conductive segments 204a, 204f, 204c and 204h can be construed as being associated with the first differential-type amplifier 212a, while first conductive segments 204b, 204e, 204d and 204g can be construed as being associated with the second differential-type amplifier 212b.

The arrangement of FIG. 4B produces a different differential-type amplifier association for the lower conductive segments (204a–204h) due to the different construction of the reconnector circuits (210a and 210b). The switching operation of the reconnector circuits (210a and 210b) of FIG. 4B makes it possible for first conductive segments 204a–204d to be construed as being associated with the first differential-type amplifier 212a, while first conductive segments 204e–204h can be construed as being associated with the second differential-type amplifier 212b.

Figure 1A:
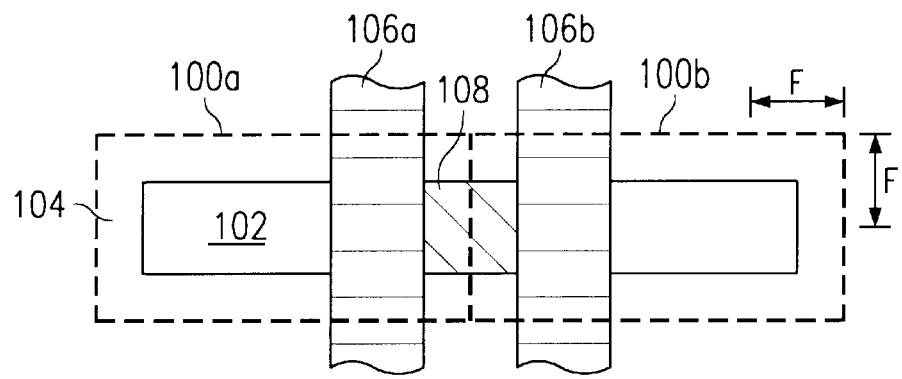
FIGS. 1A–1E are top plan views illustrating a prior art DRAM memory cell array.
Figure 1B:
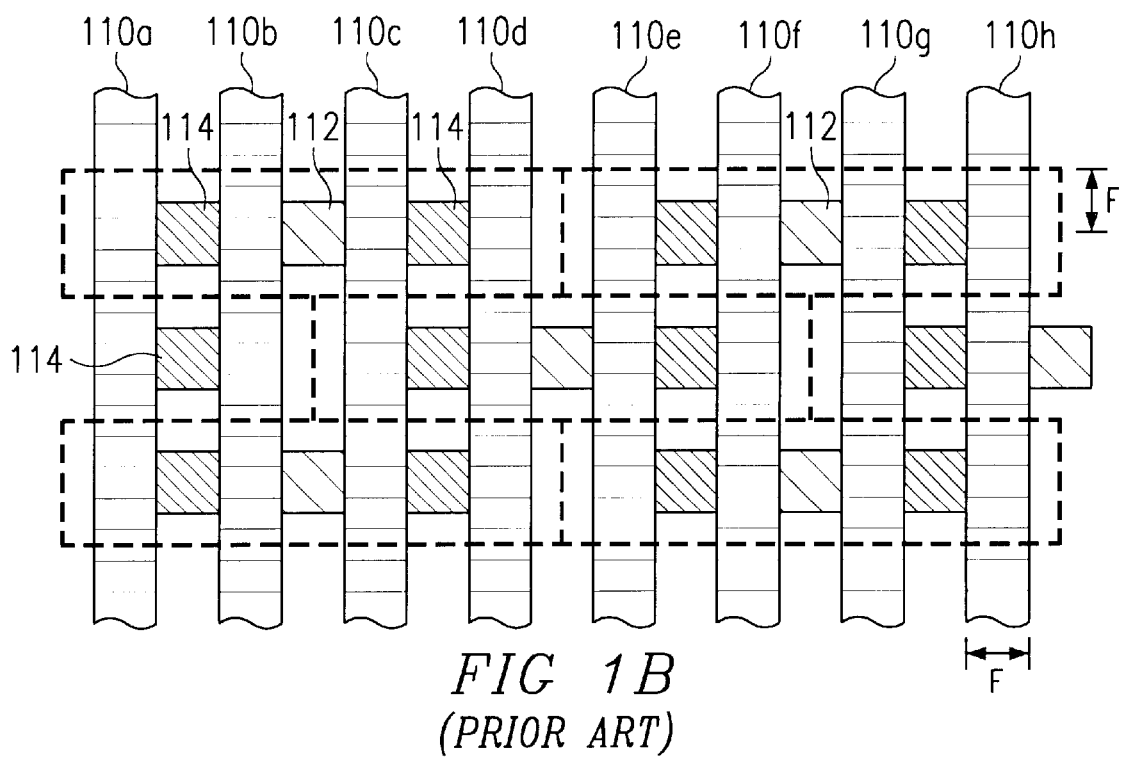
Figure 1C:
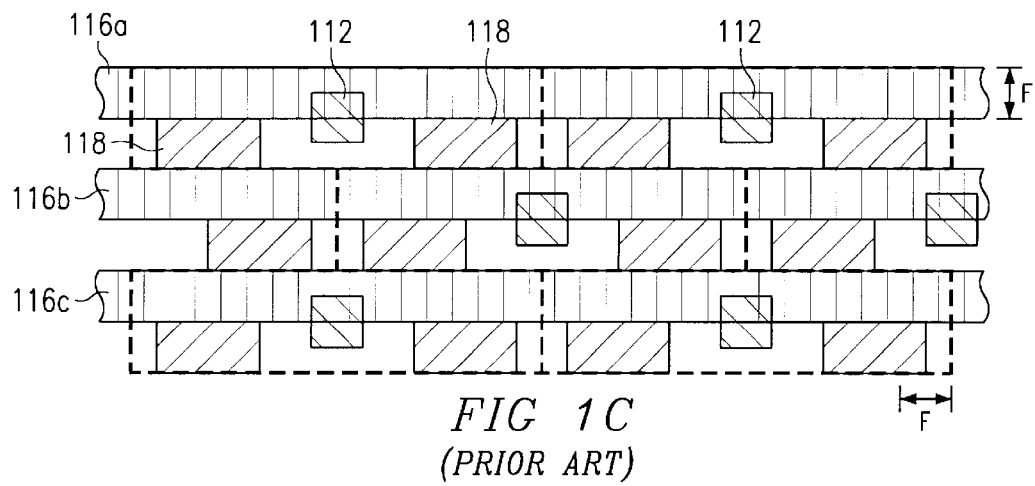
Figure 1D:
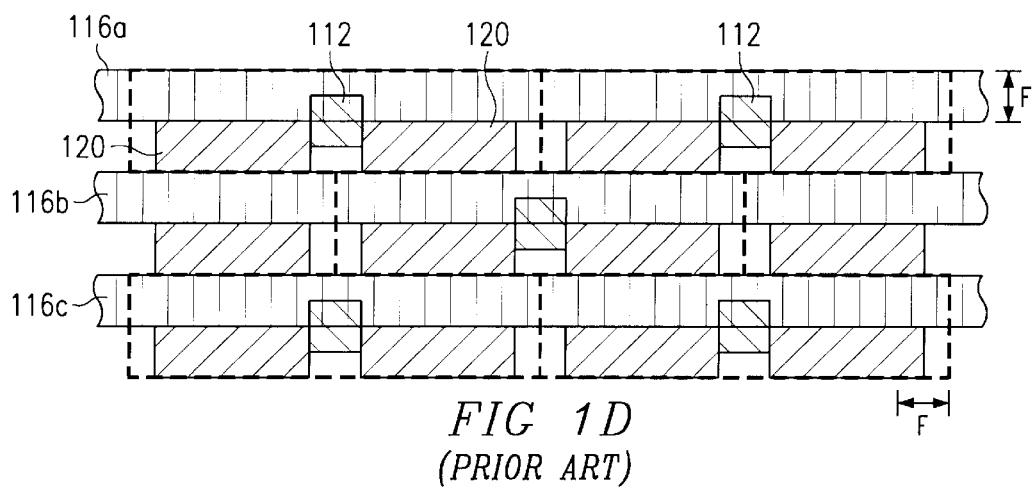
Figure 1E:
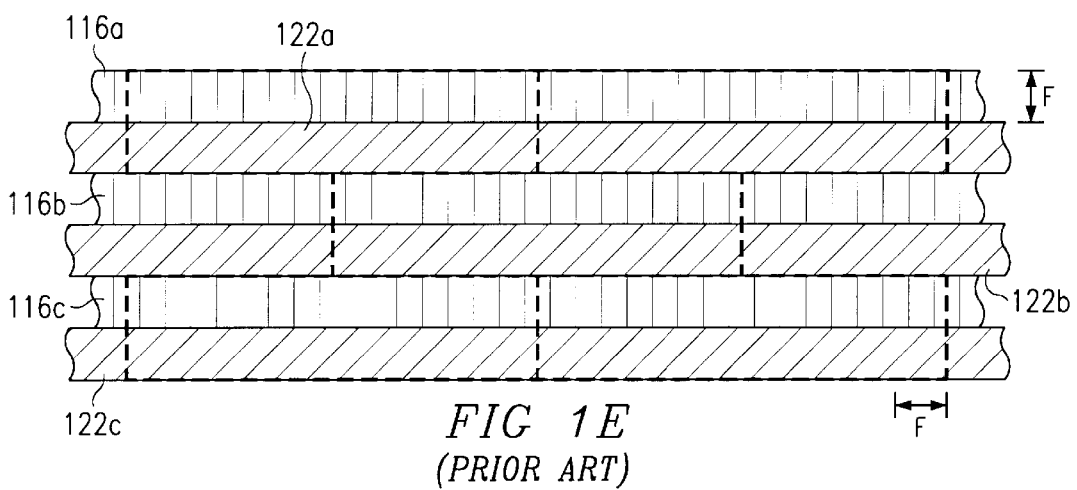

By allowing the activation of adjacent unit circuits (such as 202' in FIGS. 4A and 4B), while still providing noise reduction and impedance matched inputs, the hierarchical conductive segment arrangement of the first embodiment can be employed in highly dense unit circuit arrangements. For example, the unit circuits 202 of FIG. 2 can be $8F^2$ DRAM cells, such as those set forth in FIG. 1A, but arranged in an open bit line configuration with respect to the lower conductive segments. However, the hierarchical arrangement may also be particularly useful when utilized with even denser memory cell arrangements. One example of such an application is set forth in a second embodiment in FIGS. 5A–5E, which illustrates the hierarchical conductive segments arrangement as used in a "$6F^2$" memory cell array.

Figure 5A:
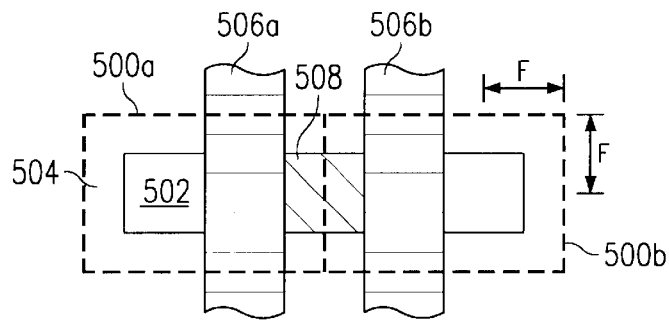
FIGS. 5A–5E are top plan views illustrating a second embodiment.

FIG. 5A is a top plan view illustrating two memory cells, each having an area equal to $6F^2$, where the value F is a minimum dimension size. The memory cells are designated by the general reference characters 500a and 500b, and are shown to be formed in an active area 502, having dimensions of 1F×5F, that is surrounded by an insulation region 504, having a width of 0.5F. Each of the memory cells (500a and 500b) includes an associated word line (506a and 506b) formed over the active area 502, resulting in the creation of a metal-oxide-semiconductor (MOS) pass transistor. The memory cells (500a and 500b) share a common bit line contact 508 that is formed between the word lines (506a and 506b). The pair of memory cells (500a and 500b) has a total area of $12F^2$.

Figure 5B:
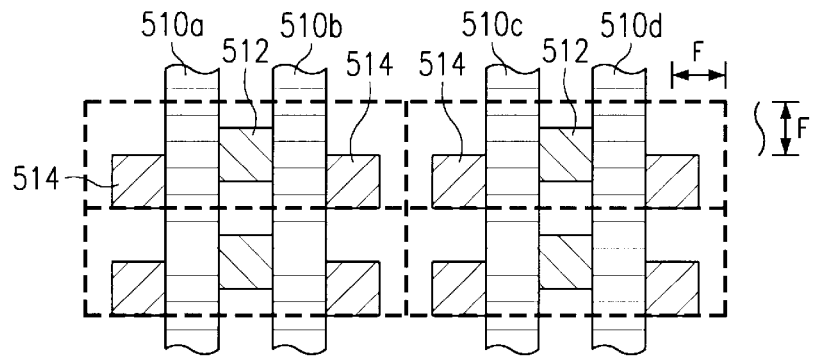

The arrangement of the DRAM array of the second embodiment is described by a series of top plan views in FIGS. 5B to 5E, in which adjacent memory cell pairs, such as those shown in FIG. 5A, are outlined by a bold dashed line. FIG. 5B illustrates an array of four memory cell pairs (or alternatively an array of eight memory cells). The memory cell pairs are arranged in a "zero" pitch array, in that the memory cells are aligned with one another in both a column direction (horizontal in FIG. 5B) and a row direction (vertical in FIG. 5B). FIG. 5B illustrates the word lines (510a–510d) of the DRAM array as well as the bit line contacts. Only selected bit line contacts are indicated by the reference character 512 to not unduly clutter the figure. The word lines (510a–510d) can be considered to correspond to the control line shown as 206a–206l in FIG. 2. In addition, the view of FIG. 5B also includes the storage node contacts for each of the memory cells. Selected storage node contacts are shown as items 514. The storage node contacts 514 connect the transistors formed within the substrate to storage capacitors that are disposed above the substrate. The bit lines contacts 512 connect lower conductive segments to the substrate (and hence the memory cells).

In the particular arrangement of FIG. 5B, given a minimum feature size F, two word lines (510a and 510b) are repeated in the column direction over a distance 6F. Similarly, the storage node contacts 514 are repeated in the column direction in the same fashion. In the row direction, the storage node contacts 514 are repeated over a distance 2F (have a pitch of 2F). The bit line contacts 512 have a pitch in the column direction of 6F and a pitch in the row direction of 2F.

Figure 5C:
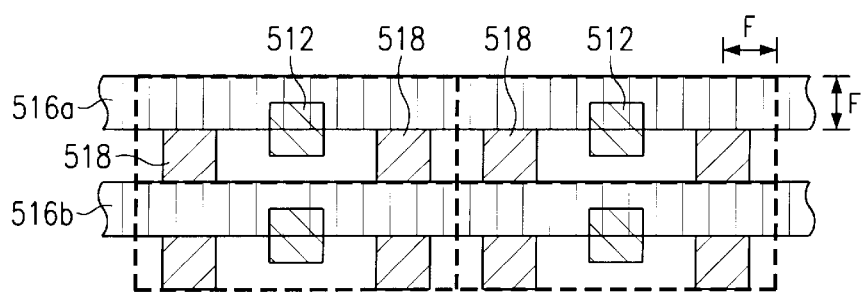

FIG. 5C is a top plan view of the same four memory cell pairs, illustrating the formation of layers on top of those set forth in FIG. 5B. Included in FIG. 5B are lower bit line segments (516a–516b) and storage nodes (selected of which are identified as items 518). In addition, to better understand the positioning of these structures in relation to the rest of the array, the bit line contacts 512 have been carried over from FIG. 5B. The storage node arrangement of FIG. 5C illustrates a "capacitor-under-bit line" (CUB) arrangement. Thus, the storage nodes 518 are formed prior to the bit line contacts 512. One skilled in the art would recognize that the storage nodes 518 form one plate of a storage capacitor. Accordingly, after the formation of the storage nodes 518 a capacitor dielectric would be deposited. A common plate would then be formed over the capacitor dielectric, thereby completing the capacitor structures for the array. The lower bit line segments (516a and 516b) are shown to extend over the substrate, perpendicular to the word lines (510a–510d), and make contact with the substrate of each memory cell pair by way of the bit line contacts 512. The lower bit line segments (516a and 516b) would correspond to the lower conductive segments shown as 204a–204h in FIG. 2. The lower bit line segments (516a and 516b) can thus be considered "open" bit line segments, as they are formed to a simultaneously accessed matching bit line segment.

In the particular arrangement of FIG. 5C, the lower bit line segments (516a and 516b) are shown to have a pitch in the row direction of 2F. The storage nodes 518 have the same pitch arrangement as the storage node contacts 514 of FIG. 5B.

Figure 5D:
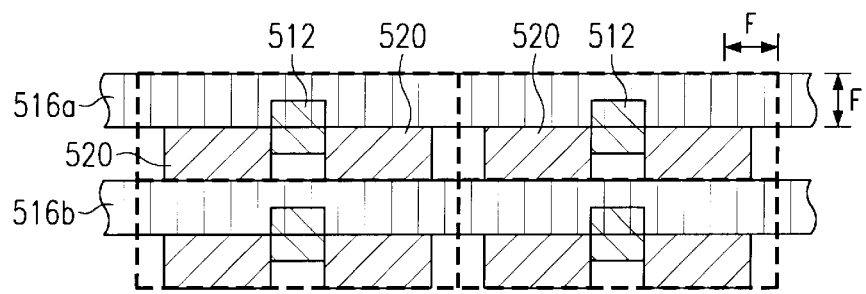

While the second embodiment of can utilize CUB arrangements, the memory cell array can also utilize capacitor-over-bit line (COB) arrangements, as well. FIG. 5D is essentially the same view as FIG. 5C, but illustrates a COB arrangement instead of a CUB arrangement. In FIG. 5D the peripheral edges of the memory cell pairs are defined by bold dashed lines, and the lower bit line segments (516a and 516b) and bit line contacts 512 are described by the same reference characters as FIG. 5C. FIG. 5D differs from FIG. 5C in that it includes COB type storage nodes (selected of which are shown as items 520). The COB type storage nodes 520 are formed after the lower bit line segments (516a and 516b) allowing for the storage nodes to be larger, as no minimum spacing from the bit line contacts 512 is required. As discussed in conjunction with FIG. 5C, following the formation of the COB type storage node, a capacitor dielectric and a common plate are formed, completing the capacitor structures for the memory cell. Like the CUB arrangement, the storage nodes 520 have the same pitch arrangement as the storage node contacts 514 of FIG. 5B.

Figure 5E:
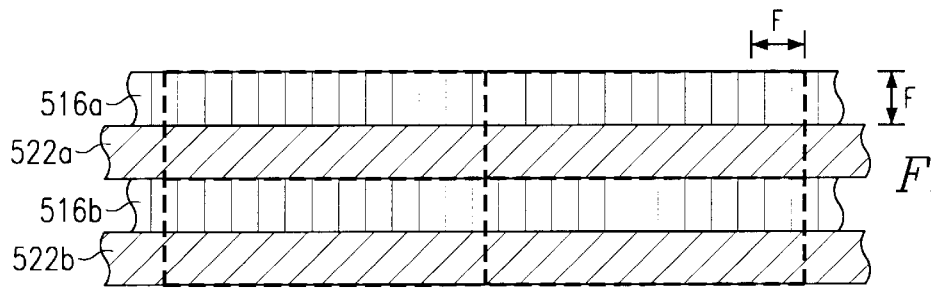

FIG. 5E illustrates the formation of the upper bit line segments (522a and 522b) according to the second embodiment. For reference, the lower bit line segments (516a and 516b) have been included in the view. As shown in FIG. 5E, in the second embodiment, the upper bit line segments (522a and 522b) are formed generally parallel to the lower bit line segments (516a and 516b). The upper bit line segments (522a and 522b) correspond to the higher conductive segments shown as items 208a–208f in FIG. 2. The upper bit line segments (522a and 522b) can thus be considered to be arranged in "folded" upper bit line segment pairs, as they are each formed to a simultaneously accessed matching upper bit line segment. It is understood that the upper bit line segment (522a and 522b) are coupled to corresponding lower bit line segments by two reconnector circuits disposed at each end of the upper bit line segments. In this manner, the hierarchical bit line structure can be used to provide a memory cell array that utilizes the very compact $6F^2$ memory cell, but not in a completely open bit line architecture. Instead, noise is reduced through the use of folded upper bit line segments. In addition, the impedance present at the inputs of differential-type amplifier circuits is matched by coupling the same number of identically formed upper bit line segments and lower bit line segments to the inputs of the differential type amplifier. In the particular arrangement of FIG. 5E, the pitch of the upper bit line segments (522a and 522b) like that of the lower bit line segments (516a and 516b) is equal to 2F in the row direction.

Referring now to FIGS. 6A–6D, a third DRAM embodiment will be described by a series of top plan views. The third embodiment utilizes the dense $6F^2$ type memory cell set forth in FIG. 5A. The memory cells are arranged into adjacent memory cell pairs, each sharing a bit line contact and having a total area of $12F^2$. Within each of the views of FIGS. 6A–6D, the area of each memory cell pair is defined by bold dashed lines.

Figure 6A:
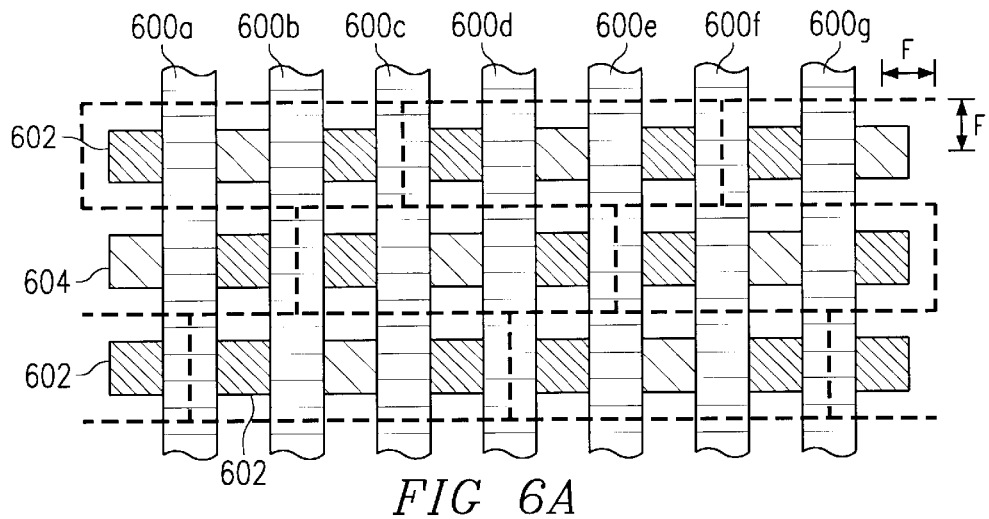
FIGS. 6A–6D are top plan views illustrating a third embodiment.

Referring now to FIG. 6A, if reference is made to the defined memory cell area, the memory cell pairs are shown to be arranged in a "⅓" pitch array. That is, in the column direction (horizontal in the views of FIGS. 6A–6D), the memory cell pairs are offset from one another by ⅓ the total length of the memory cell pairs. Word lines (600a–600g) are formed over the substrate, in a more dense arrangement than that of the second embodiment. A series of storage node contacts are also formed, one for each memory cell. Selected of the storage node contacts are identified by the reference character 602. All of the storage node contacts are not identified to avoid cluttering the view. In addition, bit line contacts are also set forth in FIG. 6A, one bit line contact corresponding to each memory cell pair. Selected of the bit line contacts are identified by the reference character 604. As in the case of the storage node contacts, not every bit line contact 604 is identified to avoid cluttering the view. The storage node contacts 602 couple storage node capacitors to the substrate. The bit line contacts 604 couple lower bit lines (lower conductive segments) to the substrate (and hence the memory cells).

In the particular arrangement of FIG. 6A, given a minimum feature size F, the word lines (600a–600g) have a pitch of 2F. The storage node contacts 602 and bit line contacts 604 have the same general pitch configuration as the storage node contacts 514 and bit line contacts 512 of FIG. 5B.

Figure 6B:
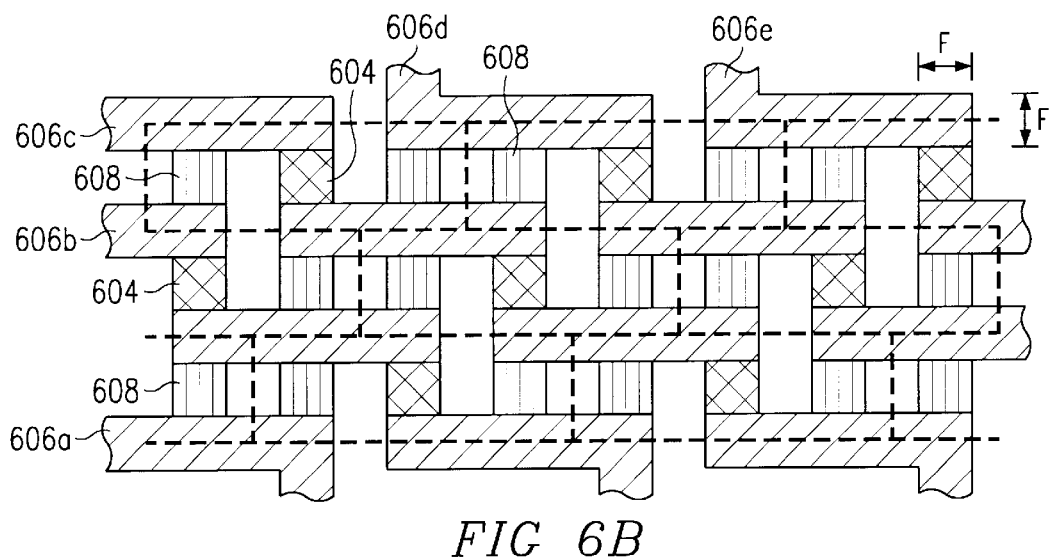

FIG. 6B repeats the view of FIG. 6A, but illustrates the formation of subsequent layers. Included within FIG. 6B are lower bit line segments (606a–606e) and a number of storage nodes. Selected storage nodes are identified by the reference character 608. Furthermore, to better understand the positioning of the bit line segments (606a–606e) and storage nodes 608, the bit line contacts 604 from FIG. 6A have been repeated in FIG. 6B. In a similar fashion to FIG. 5C, FIG. 6B illustrates a CUB memory cell arrangement. It is therefore understood that the storage nodes 608 form but one plate of a storage capacitor. A capacitor dielectric and common plate would be formed over the storage node to complete the DRAM cell storage capacitor structures.

FIG. 6B illustrates a unique aspect of the third embodiment. As shown in the figure, the lower bit line segments (606a–606e) run in a diagonal direction across the substrate. This arrangement can provide for more reliable alignment of the lower bit line segments (606a–606e) with the bit line contacts 604. The lower bit line segments (606a–606e) would correspond to the lower conductive segments shown as 204a–204h in FIG. 2. The lower bit line segments (606a–606e) can be considered "open" bit line segments as they are formed next to a simultaneously accessed matching bit line segment.

In the particular arrangement of FIG. 6B, two lower bit line segments (606a–606e) repeat over a distance of 6F in the row direction. In the column direction the lower bit line segments (606a–606e) have a pitch of 6F. The storage nodes 608 have the same pitch arrangement as the storage node contacts 602.

Figure 6C:
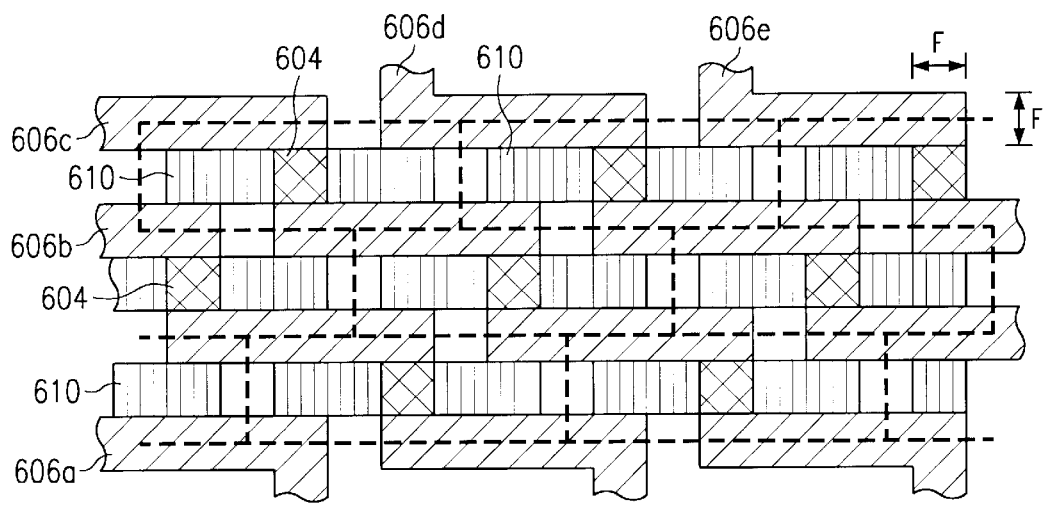

FIG. 6C is essentially the same view as FIG. 6B, but illustrates a third embodiment that utilizes a COB arrangement instead of a CUB arrangement. FIG. 6C thus includes the same lower bit line segments (606a–606e) and bit line contacts 604 as FIG. 6B. Unlike FIG. 6B, FIG. 6C includes COB type storage nodes. Selected COB type storage nodes are identified by the reference character 610. Storage capacitor structures will subsequently be completed by forming a capacitor dielectric over the storage nodes, and a common plate of the capacitor dielectric. The COB type storage nodes 610 have the same pitch arrangement as the storage node contacts 602.

Figure 6D:
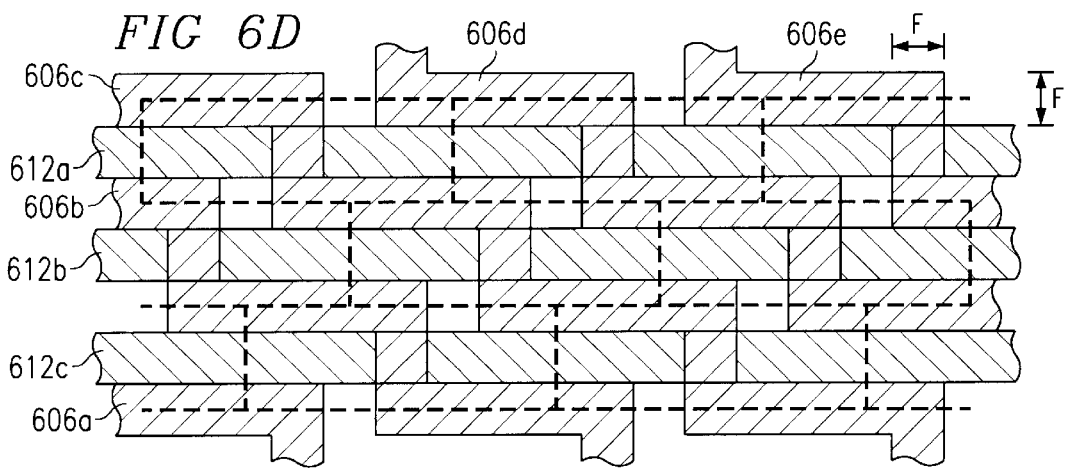

FIG. 6D illustrates the formation of the upper bit line segments (612a–612c) according to the third embodiment. For reference, the lower bit line segments (606a–606e) have been carried over from the views of FIG. 6B and 6C. The upper bit line segments (612a–612c) are disposed in the column direction, which is in contrast to the diagonal arrangement of the lower bit line segments (606a–606e). The upper bit line segments (612a–612c) correspond to the higher conductive segments shown as items 208a–208f in FIG. 2. Thus, the upper bit line segments (612a–612c) can be considered to be arranged in to "straight" folded upper bit line segment pairs disposed over "diagonal" open lower bit line segments (606a–606e). In the third embodiment, the upper bit line segments (612a–612c) are coupled to corresponding lower bit line segments by two reconnector circuits disposed at each end of the upper bit line segments. In this manner, when diagonal lower bit line segments are employed, the hierarchical bit line structure can be used to provide a highly dense memory cell array using $6F^2$ memory cells with reliable bit line contacts. As in the case of the second embodiment, folded upper bit line segments and matched impedance loads can lead to improved memory device performance. The upper bit line segments (612a–612c) have a pitch in the row direction of 2F.

Figure 7:
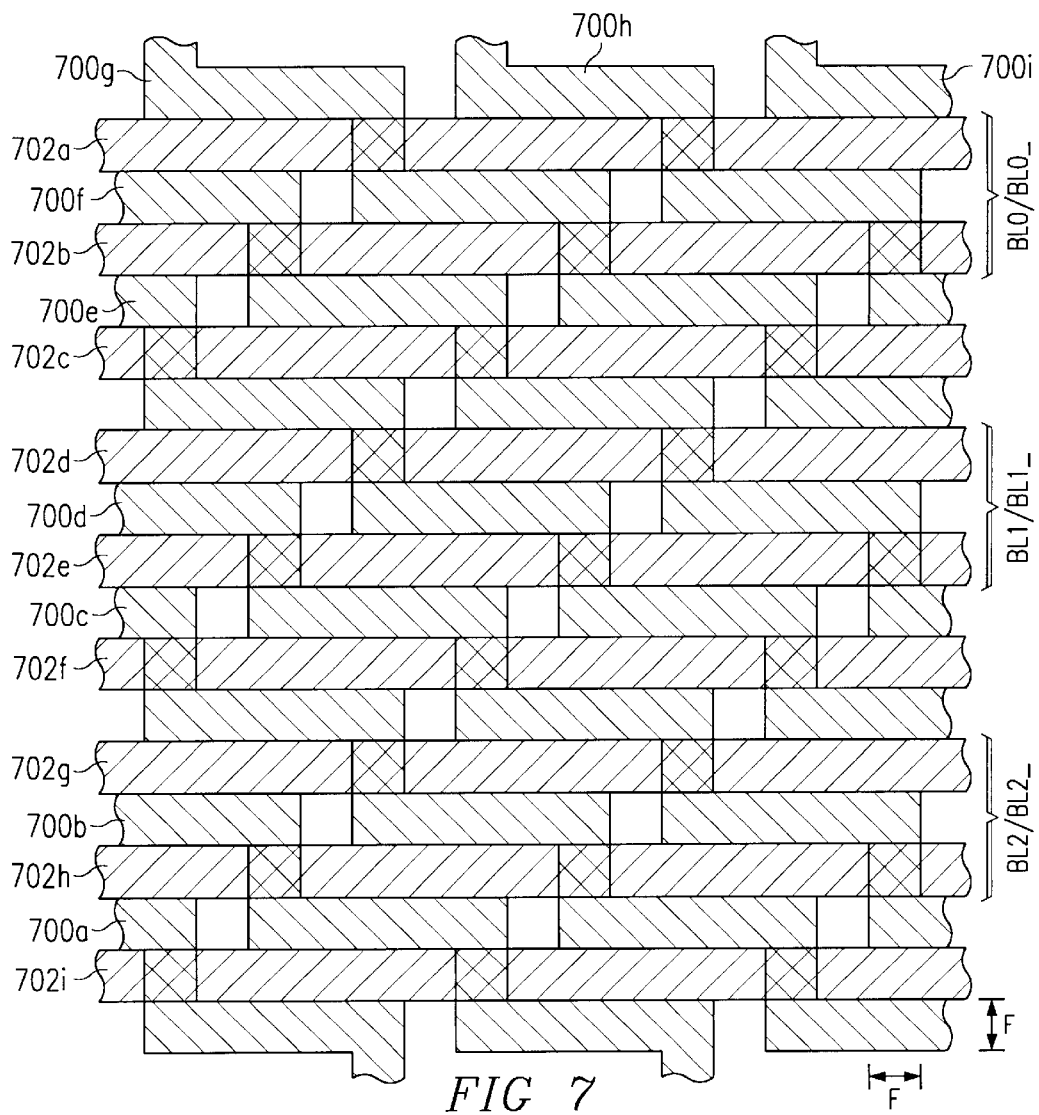
FIG. 7 is a top plan view illustrating the upper and lower bit line segment arrangement of the third embodiment.

Referring now to FIG. 7, the lower and higher conductive segment arrangement of the third embodiment is set forth in a top plan view. The diagonal lower conductive segments are designated by the reference characters 700a–700i, and the straight higher conductive segments are designated by the reference characters 702a–702i. FIG. 7 illustrates how the higher conductive segments (702a–702i) have a smaller pitch than the lower conductive segments (700a–700i). In particular, assuming the same minimum feature size of F, the higher conductive segments (702a–702i) have a pitch of 2F in the row direction (vertical in FIG. 7). In contrast, two lower conductive segments (700a–700i) are repeated over a distance of 6F, thereby having a pitch equivalent to 3F.

In a memory application, the difference in pitch between the lower conductive segments (700a–700i), which function as lower bit line segments, and the higher conductive segments (702a–702i), which function as upper bit line segments, results in there being more upper conductive segments (702a–702i) than are necessary to provide access to the lower bit line segments (700a–700i). As a result, some of the higher conductive segments (702a–702i) can be used for other purposes. This is illustrated in FIG. 7, which identifies certain higher conductive segment pairs (702a/702b, 702d/702e and 702g/702h) as upper bit line pairs (UBL0/UBL0_, UBL1/UBL1_, UBL2/UBL2_). The remaining higher conductive segments (702c, 702f and 702i), which advantageously run across the array, can be used as "Y-select" lines (lines that select a given columns) or power supply lines, as just two possible examples.

Figure 8:
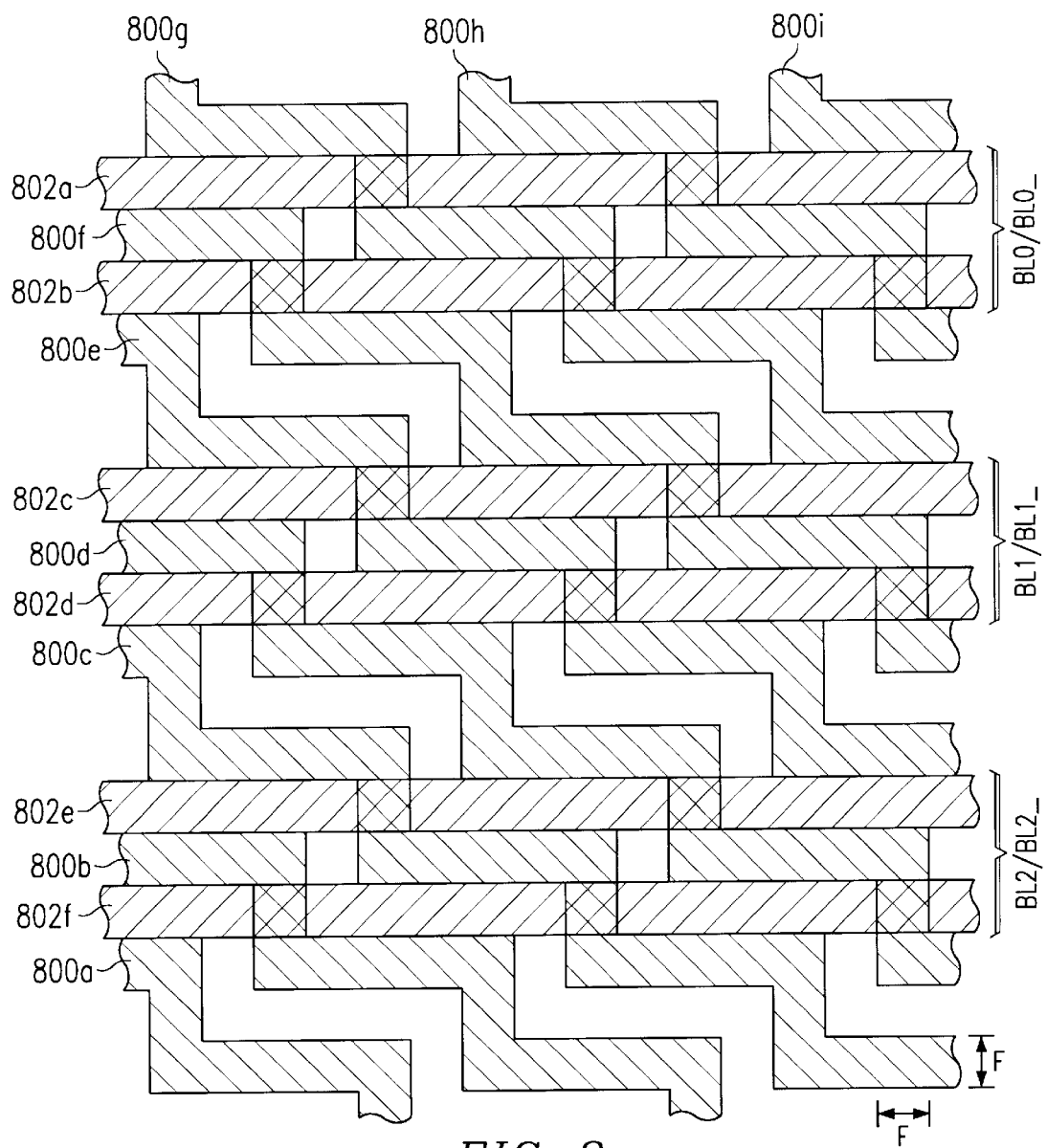
FIG. 8 is a top plan view illustrating a fourth embodiment.

FIG. 8 is a top plan view of a fourth embodiment. The fourth embodiment is like the third embodiment, and includes lower conductive segments (800a–800i) and higher conductive segments (802a–800f). However, unlike the third embodiment, the fourth embodiment does not include any "extra" higher conductive segments in the portion illustrated. Thus, the particular higher conductive segments (802a–800f) illustrated function as upper bit line segments only.

Figure 9:
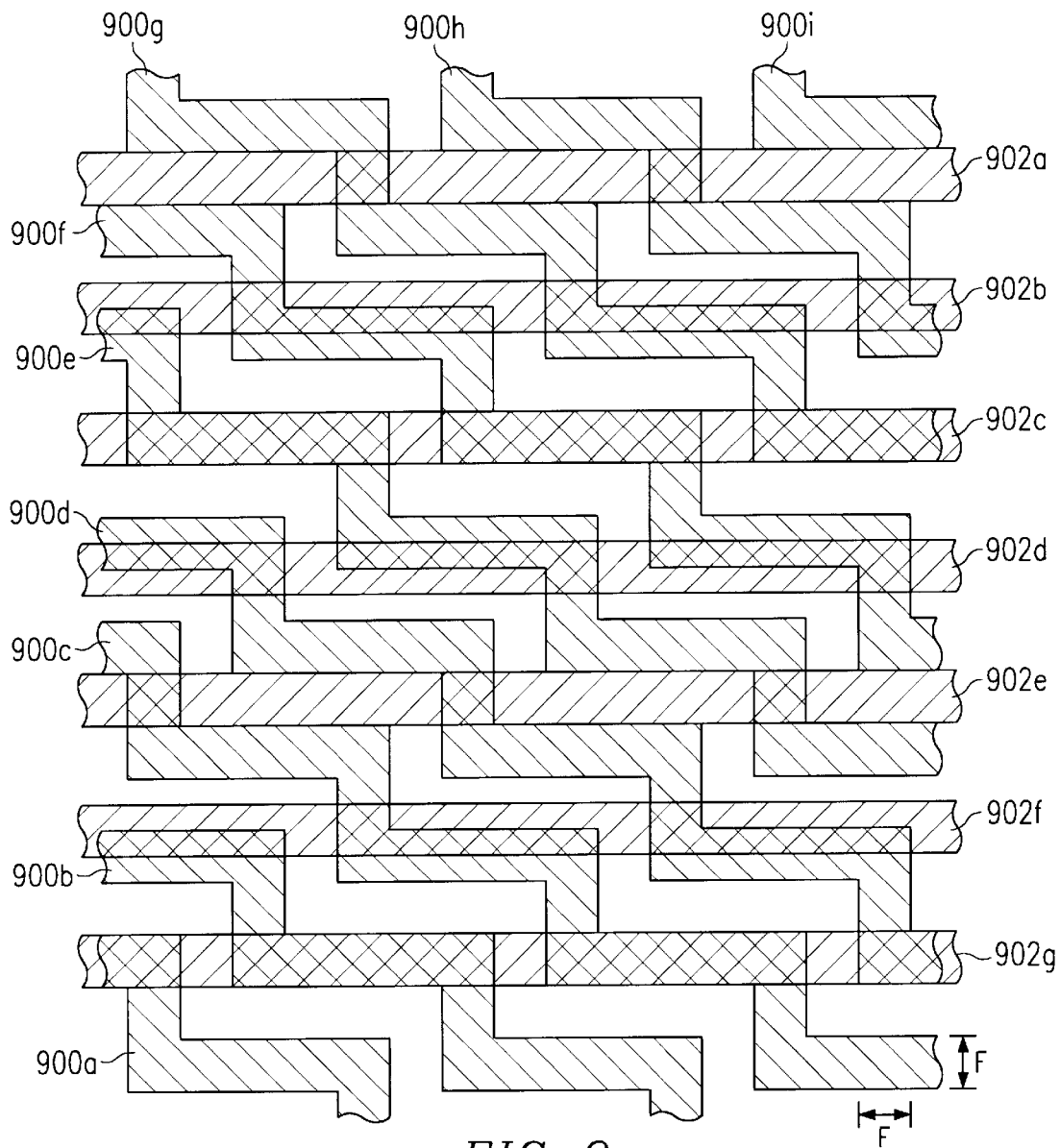
FIG. 9 is a top plan view illustrating a fifth embodiment.

Referring now to FIG. 9, a top plan view is set forth illustrating a fifth embodiment. The fifth embodiment is like the third and fourth embodiments, and includes lower conductive segments (900a–900i) and higher conductive segments (902a–902g). The fifth embodiment illustrates a memory device application in which the higher conductive segments (902a–902h) are formed with a "relaxed" pitch. That is, because there is more room than is necessary to provide sufficient upper bit lines for the lower bit lines, the upper bit lines are not formed with a minimum pitch (2F), but instead are formed with a greater pitch.

Figure 10:
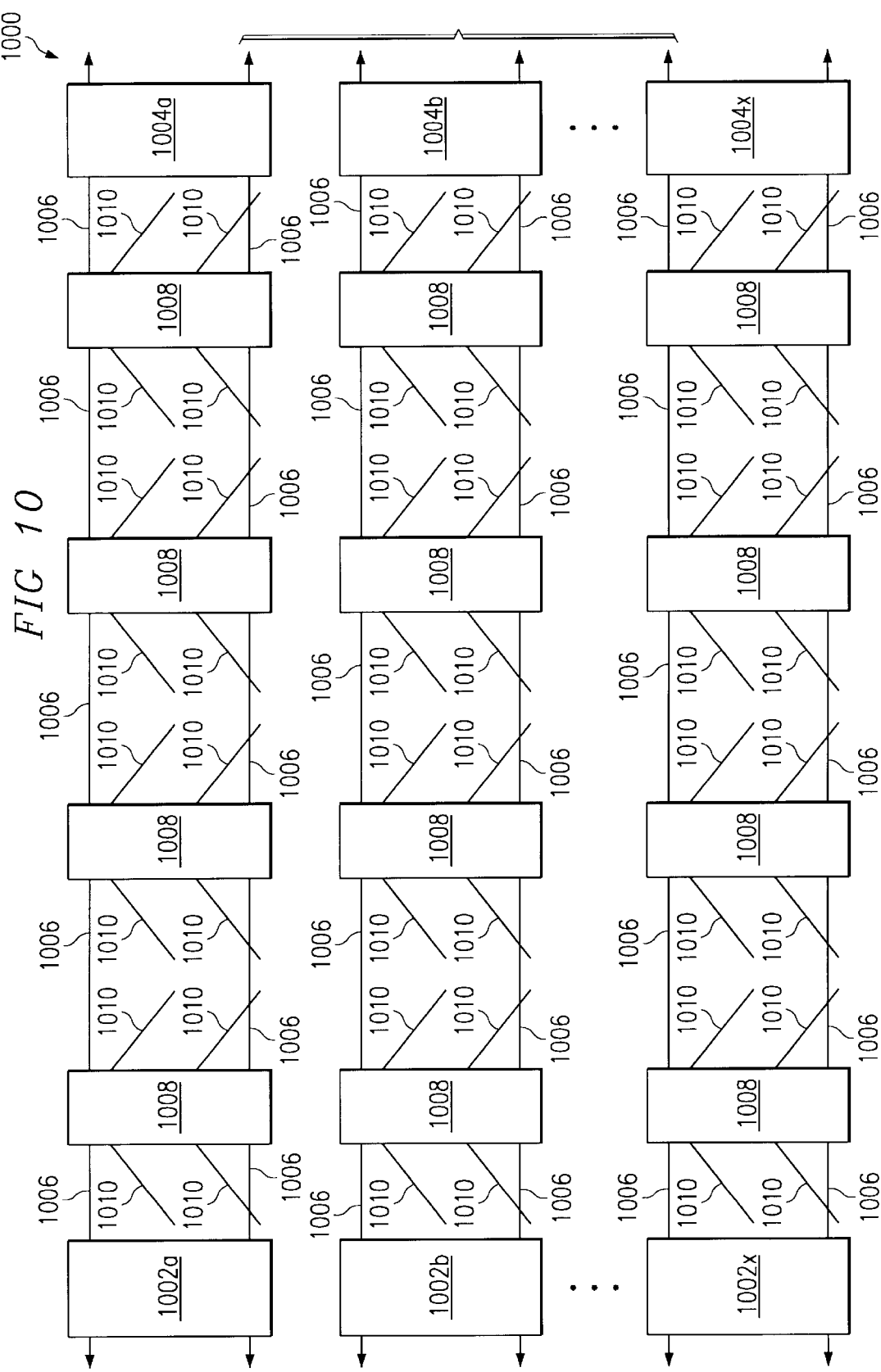
FIG. 10 is a block schematic diagram of a sixth embodiment.

Referring now to FIG. 10, a sixth embodiment is set forth in a block schematic diagram. The sixth embodiment illustrates how the general structure set forth in FIG. 2 can be repeated to generate a larger memory device array structure. The sixth embodiment is designated by the general reference character 1000 and sets forth an array structure. The sixth embodiment 1000 includes a left bank of differential-type amplifiers 1002a–1002x, and a right bank of differential-type amplifiers 1004a–1004x. A series of higher conductive segments 1006 are disposed between each left differential-type amplifier (1002a–1002x) and a corresponding right differential-type amplifier (1004a–1004x). The higher conductive segments 1006 are connected to one another by reconnector circuits 1008 situated between adjacent folded higher conductive segment pairs. Furthermore, each reconnector circuit 1008 is coupled to four lower conductive segments 1010. The lower conductive segments 1010 are situated at an angle with respect to the higher conductive segments 1006, to indicate that the array can include diagonal lower bit lines. As indicated by the figure, the lower conductive segments 1010 to one side of the reconnector circuits 1008 will be disposed at one diagonal, while the lower conductive segments 1010 on the other side of the reconnector circuits 1008 are disposed at a different diagonal. This should not be construed as limiting the sixth embodiment, however. The lower bit lines could be disposed parallel to the upper bit lines, such as the arrangement shown in the second embodiment of FIGS. 5A–5E.

In the sixth embodiment 1000, the differential-type amplifiers (1002a–1002x and 1004a–1004x) define array columns. That is differential-type amplifiers 1002a and 1004a, and the higher and lower conductive segments (1006 and 1010) between, are within a first column. It is also noted that the differential-type amplifiers (1002a–1002x and 1004a–1004x) can be shared with an adjacent array. This is illustrated in FIG. 10 by the differential-type amplifiers (1002a–1002x and 1004a–1004x) being coupled to higher conductive segment pairs on both their left and right sides.

It is noted that the when diagonal lower conductive segments 1010 are used in an arrangement such as that of FIG. 10, the overall size of the memory device can be reduced. In a memory device, the differential-type amplifiers are sense amplifiers that are coupled to the lower bit lines (lower conductive segments 1010). Because the lower bit lines 1010 are diagonally arranged in the array, arrangements are possible in which each lower bit line 1010 will access more memory cells than if the lower bit lines had been straight (disposed horizontally in FIG. 10). In this manner, an array of diagonal bit lines can require fewer sense amplifiers to access the same number of memory cells. Fewer sense amplifiers reduces the overall size of the memory device.

Figure 11A:
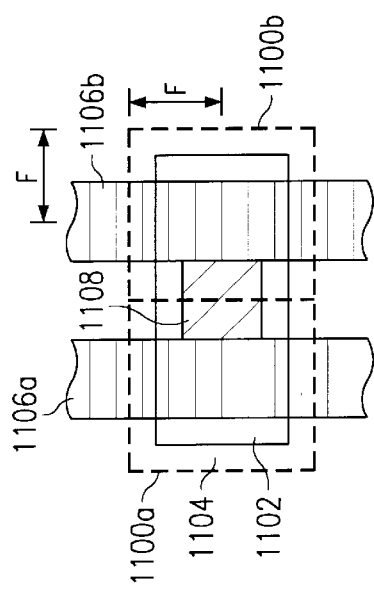
FIG. 11A–11D are top plan views illustrating a seventh embodiment.

Referring now to FIGS. 11A–11D, a seventh embodiment is set forth in a series of top plan views. The seventh embodiment sets forth an even smaller memory cell utilized in conjunction with a hierarchical bit line scheme. FIG. 11A is a top plan view illustrating a memory cell having a $4F^2$ area, where F is a minimum feature size.

FIG. 11A is a top plan view illustrating two adjacent $4F^2$ memory cells. The memory cells are designated by the general reference characters 1100*a* and 1100*b*, and are shown to be formed in an active area 1102 that is surrounded by an insulation region 1104. A smaller insulation area width is achievable using advanced isolation techniques, such as silicon trench isolation (STI). Each of the memory cells (1100*a* and 1100*b*) includes an associated word line (1106*a* and 1106*b*) formed over the active area, resulting in the creation of a MOS pass transistor. As in the previous DRAM embodiments, the memory cells (1100*a* and 1100*b*) share a common bit line contact 1108. The memory cell pair (1100*a* and 1100*b*) occupies a total area of 8F$^2$.

Figure 11B:
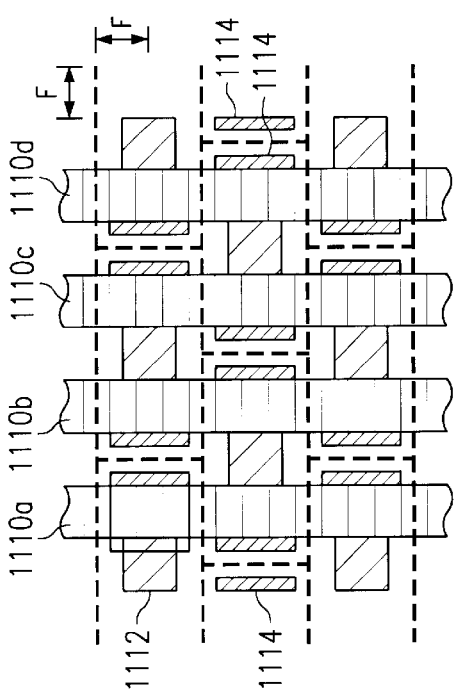

FIG. 11B illustrates a memory cell array according to the seventh embodiment. Adjacent 4F$^2$ memory cell pairs, such as those shown in FIG. 11A, are outlined by a bold dashed line. FIG. 11B illustrates an array having a "½" pitch array. Memory cells pairs are offset from adjacent memory cell pairs in the column direction by half the total length of a memory cell pair. FIG. 11B illustrates the word lines (1110*a*–1110*d*) of the DRAM array, as well as the bit line contacts associated with each memory cell pair. Selected bit line contacts are designated by the reference character 1112. The word lines (1110*a*–1110*d*) can be considered to correspond to the control lines (206*a*–206*l*) of FIG. 2. FIG. 11B also illustrates storage node junctions for each of the memory cells. Selected storage node junctions are designated by the reference character 1114. The storage node junctions 1114 are formed where storage capacitors are connected to the substrate. The bit line contacts 1112 connect lower bit lines to the memory cells.

The particular arrangement of FIG. 11B provides for a very compact arrangement of array elements. The word lines (1110*a*–1110*d*) have a pitch of 2F in the column direction. The bit line contacts 1112 have a pitch of 4F in the column direction and 2F in the row direction. Two storage node junctions 1114 repeat over a distance of 4F in the column direction, and have a pitch of 2F in the row direction.

Figure 11C:
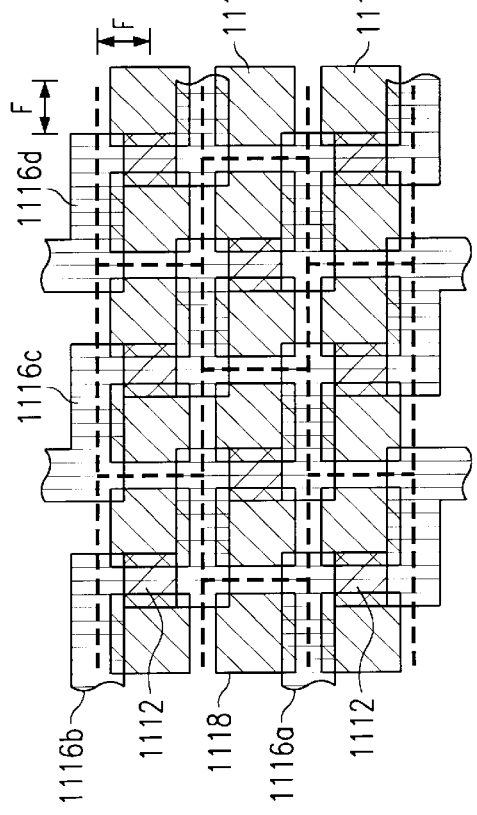

FIG. 11C sets forth the same view as FIG. 11B, with subsequently formed layers. Included within FIG. 11C are lower bit line segments (1116*a*–1116*d*) and a number of storage nodes. To avoid unduly confusing the figure, only selected storage nodes are identified by the reference character 1118. To provide a reference for the structures of FIG. 11B, FIG. 11C repeats the bit line contacts 1112 of FIG. 11C. It is noted that the storage nodes 1118 form a COB type arrangement, and so are formed over the lower bit line segments (1116*a*–1116*d*). The formation of a capacitor dielectric and common plate would complete the capacitor structures. The lower bit line segments (1116*a*–1116*d*) are arranged diagonally with respect to the column and row directions.

In the particular arrangement of FIG. 11C, the lower bit line segments (1116*a*–1116*d*) have a pitch in both the column direction and the row direction of 4F. The storage nodes 1118 have a pitch of 2F in both to row and column directions.

Figure 11D:
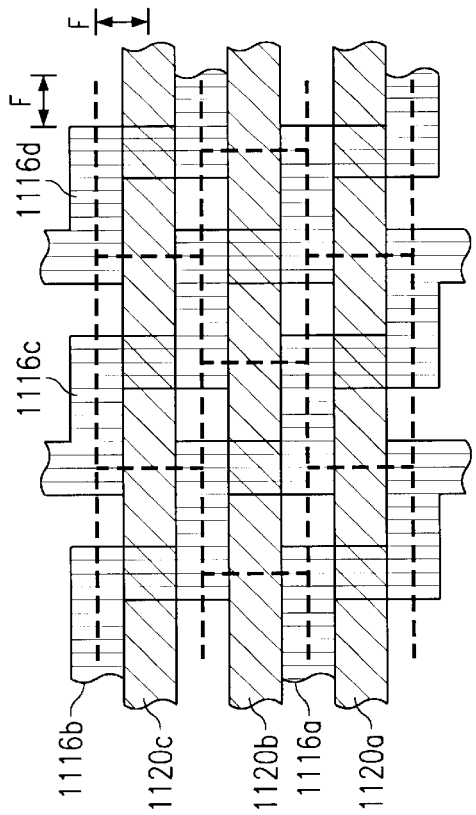

FIG. 11D provides a top plan view of subsequently formed higher conductive segments (1120*a*–1120*c*) in relationship to the lower bit line segments (1116*a*–1116*d*). The higher conductive segments (1120*a*–1120*c*) are "straight," and extend in the column direction. Selected of the higher conductive segments (1120*a*–1120*c*) can be considered to correspond to the higher conductive segments (208*a*–208*f*) in FIG. 2. FIG. 11D also illustrates the advantageous difference in pitch between the higher conductive segments (1120*a*–1120*c*) and lower bit line segments (1116*a*–1116*d*). Given a minimum feature size F, the higher conductive segments (1120*a*–1120*c*) have a pitch (in the row direction) of 2F. In contrast, the lower bit line segments (1116*a*–1116*d*) have a pitch of 4F. As a result, there are twice as many higher conductive segments (1120*a*–1120*d*) as are necessary to function as upper bit lines. Accordingly, the additional higher conductive segments (1120*a*–1120*d*) may be utilized for other purposes, such as Y-select circuits or power supply lines, as previously described. Of course, as understood by the embodiment of FIG. 9, the higher conductive segments could be used as upper bit lines with a relaxed pitch.

It is understood that while some of the embodiment have been discussed in terms of a DRAM, other types of semiconductor devices can benefit from the teachings set forth herein. Nonvolatile memory devices, such as electrically programmable read-only-memories (EPROMs), electrically erasable and programmable read-only-memories (EPROMs), "flash" EPROMs, and ferroelectric RAMs (FRAMs or FeRAMs) could realize more compact array arrangements as taught by the various embodiments. In addition, volatile memory devices other than DRAMs could also benefit, such as static RAMs (SRAMs), as just one example. Finally, devices employing unit circuits other than memory cells could employ the teachings or the various embodiments, such as programmable logic (gate) arrays and devices.

Thus, it is understood that while the present invention has been described in terms of a number of detailed embodiments, various changes, substitutions, and alterations could be made without departing from the spirit and scope of the invention. Accordingly, the present invention is intended to be limited only as defined by the appended claims.

What is claimed is:

1. A semiconductor device, comprising:
   a plurality of like unit circuits formed in a semiconductor substrate;
   a plurality amplifier circuits arranged into at least a group of first amplifier circuits and a group of second amplifier circuits, each amplifier circuit having a first input and a second input;
   a plurality of higher order conductive segments, including
      a plurality of first higher order conductive segments arranged in series between the first input of one of the first amplifier circuits and the first input of an associated second amplifier circuit, and
      a second higher order conductive segment associated with each first higher order conductive segment, the second higher order conductive segments being arranged in series between the second input of the first amplifier circuit and the second input of the associated second amplifier circuit,
   a plurality of lower order conductive segments coupled to the unit circuits, the lower order conductive segments being arranged into lower group pairs, each lower group pair including
      a plurality of first lower order conductive segments, and
      a plurality of second lower order conductive segments;
   a plurality of reconnector circuits, each disposed between two first higher order conductive segments and two associated second higher order conductive segments, each reconnector circuit including
      a first reconnector controllable impedance path coupled between the two first higher order conductive segments,
      a second reconnector controllable impedance path coupled between the associated two second higher order conductive segments, a first switch controllable impedance path coupled between the one of the two first higher order conductive segments and an associated first lower order conductive segment, a second switch controllable impedance path coupled between the other of the two first higher order conductive segments and another associated first lower order conductive segment, a third switch controllable impedance path coupled between the one of the two second higher order conductive segments and an associated second lower order conductive segment, and a fourth switch controllable impedance path coupled between the other of the two second higher order conductive segments and another associated first lower order conductive segment.

2. The semiconductor device of claim 1, wherein:

the like unit circuits are memory cells arranged into rows and columns; and the lower order conductive segments are bit lines for accessing the memory cells on a column-wise basis.

3. The semiconductor device of claim 2, wherein:

the memory cells are formed with structures having a minimum feature size of F, and each memory cell has area of $6F^2$.

4. The semiconductor device of claim 3, wherein:

the memory cells are arranged in adjacent pairs, each memory cell of a pair being coupled to the game bit line at a shared bit line contact.

5. The semiconductor device of claim 2, wherein:

the memory cells are dynamic random access memory (DRAM) cells that each include an access transistor and a storage capacitor.

6. The semiconductor device of claim 5, wherein:

the storage capacitors of the DRAM cells are formed over the lower order conductive segments resulting in a capacitor-over-bit line (COB) arrangement.

7. The semiconductor device of claim 5, wherein:

the storage capacitors of the DRAM cells are formed under the lower order conductive segments resulting in a capacitor-under-bit line (CUB) arrangement.

8. The semiconductor device of claim 1, wherein:

the higher order conductive segments are formed from an upper conductive layer; and the lower order conductive segments are formed form a lower conductive layer formed below the upper conductive layer.

9. The semiconductor device of claim 1, wherein:

each reconnector circuit is disposed between one first higher order conductive segment and one second higher order conductive segment situated between their associated first amplifier circuit and the reconnector circuit, and another first higher order conductive segment and another second higher order conductive segment situated between their associated second amplifier and the reconnector circuit, each reconnector circuit further includes the first switch controllable impedance path coupling the one first higher order conductive segment to an associated first lower order conductive segment that is situated between the reconnector circuit and the associated first amplifier circuit, the second switch controllable impedance path coupling the other first higher order conductive segment to an associated first lower order conductive segment that is situated between the reconnector circuit and the associated second amplifier circuit, the third switch controllable impedance path coupling the one second higher order conductive segment to an associated second lower order conductive segment that is situated between the reconnector circuit and the associated second amplifier circuit, and the fourth switch controllable impedance path coupling the other second higher order conductive segment to an associated second lower order conductive segment that is situated between the reconnector circuit and the associated first amplifier circuit.

10. The semiconductor device of claim 1, wherein:

the plurality of higher order conductive segments are disposed in a first direction; and the plurality of lower order conductive segments are disposed in the first direction.

11. The semiconductor device of claim 1, wherein:

the plurality of higher order conductive segments are disposed in a first direction; and the plurality of lower order conductive segments are disposed at acute angles with respect to the first direction.

12. The semiconductor device of claim 11, wherein;

the lower order conductive segments have a first pitch with respect to a second direction that is perpendicular to the first direction; and the higher conductive segments have the first pitch with respect to the second direction.

13. The semiconductor device of claim 11, wherein:

the lower order conductive segments have a first pitch with respect to a second direction that is perpendicular to the first direction; and the higher conductive segments have a second pitch with respect to the second direction that is greater than the first pitch.

* * * * *